(12) United States Patent
Tamiya et al.

(10) Patent No.: US 6,717,449 B2
(45) Date of Patent: Apr. 6, 2004

(54) VARIABLE RESISTANCE CIRCUIT AND APPLICATION CIRCUITS USING THE VARIABLE RESISTANCE CIRCUIT

(75) Inventors: Kosei Tamiya, Sagamihara (JP); Tetsuji Ueyama, Hachioji (JP); Masashi Saito, Akishima (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 10/272,987

(22) Filed: Oct. 17, 2002

(65) Prior Publication Data

US 2003/0076148 A1 Apr. 24, 2003

(30) Foreign Application Priority Data

Oct. 23, 2001 (JP) .................................. 2001-324970

(51) Int. Cl.$^7$ ................................................ H03L 5/00
(52) U.S. Cl. ........................ 327/308; 327/323; 327/332
(58) Field of Search ................................. 327/308, 323, 327/332, 333

(56) References Cited

U.S. PATENT DOCUMENTS 5,168,148 A    12/1992   Giebel
6,563,371 B2 *  5/2003   Buckley, III et al. ....... 327/539

FOREIGN PATENT DOCUMENTS

JP    10-065459    3/1998
JP    2000-305640  11/2000

OTHER PUBLICATIONS

J. Tow, "Active RC Filters—A State–Space Realization," *Proceedings of the IEEE*, pp. 1137–1139 (Jun. 1968).
L. C. Thomas, "The Biquad: Part II—A Multipurpose Active Filtering System," *IEEE Transactions on Circuit Theory*, vol. CT–18, No. 3, pp. 358–361 (May 1971).
L. C. Thomas, "The Biquad: Part I—Some Practical Design Considerations," *IEEE Transactions on Circuit Theory*, vol. CT–18, No. 37 pp. 350–357 (May 1971).

* cited by examiner

*Primary Examiner*—Kenneth B. Wells
(74) *Attorney, Agent, or Firm*—Straub & Pokotylo; John C. Pokotylo

(57) ABSTRACT

A variable resistance circuit and application circuits using the same capable of offsetting the variance in the manufacture of integrated circuit and the influence of ambient temperatures, including: a control circuit having a plurality of constant-current output terminals, with a constant current ratio of the output terminals varied by signals applied to a control terminal; an operational amplifier; a resistor; and a plurality of MOS transistors having the gates thereof connected in common; and one output terminal of the control circuit being connected to one end of the resistor and to an inverted input terminal of the operational amplifier and the other output terminal being connected to the drain of one MOS transistor connected at the gate thereof to an output terminal of the operational amplifier and being connected to a non-inverted input terminal of the operational amplifier; and the other end of said resistor and the source of said one MOS transistor being connected to a reference voltage terminal. Said one MOS transistor is caused to operate in the triode region so as to use as an equivalent resistance the portion between the source and drain of the other MOS transistor connected at the gate thereof to the output terminal of the operational amplifier and at the source thereof directly or through a voltage copy circuit to the reference voltage terminal.

12 Claims, 15 Drawing Sheets

1: VARIABLE RESISTANCE CIRCUIT

1: VARIABLE RESISTANCE CIRCUIT

1: VARIABLE RESISTANCE CIRCUIT

VARIABLE RESISTANCE CIRCUIT AND APPLICATION CIRCUITS USING THE VARIABLE RESISTANCE CIRCUIT

This application claims benefit of Japanese Application No. 2001-324970 filed in Japan on Oct. 23, 2001, the contents of which are incorporated by this reference.

BACKGROUND OF THE INVENTION

The present invention relates to variable resistance circuit implemented on an integrated circuit and having an equivalent resistance between terminals capable of being controlled (regulated) by an electrical signal to be applied to a control terminal, and also relates to application circuits using the variable resistance circuit such as an integrating (filter) circuit, gain control amplifier, automatic gain control circuit.

Among known filter circuits capable of regulating passband (Q-factor) are:

① Switched Capacitor type filter;

② Operational Transconductance Amplifier (OTA)-C type filter; and

③ MOSFET-C type filter.

These filters can be implemented on an integrated circuit.

Here, the passband or Q-factor in each filter is regulated (controlled) by:

① clock (frequency) in Switched Capacitor filter;

② regulating voltage or current of OTA in OTA-C filter; or

③ the gate voltage of MOSFET in MOSFET-C filter.

Shown in FIGS. 1A, 1B are the configurations of a single-end MOSFET-C type filter and totally balanced MOSFET-C type filter as disclosed in FIGS. 7 and 2 of U.S. Pat. No. 4,509,019. The passband fc thereof and resistance Rds between the source and drain of MOS transistor are given by formulas (1), (2). Included in FIGS. 1A, 1B are: operational amplifier 501; capacitance 502; MOS transistor 503; control voltage source 504; totally balanced operational amplifier 511; capacitances 512$n$, 512$p$; MOS transistors 513$n$, 513$p$; control voltage source 514; and reference voltage source 515.

$$fc = 1/(2\pi \times C \times Rds) \quad (1)$$

$$Rds = 1/\{\mu n \times Cox \times W/L \times (Vx - Vth)\} \quad (2)$$

$\mu$n: mobility of electron

Cox: capacitance of gate oxide film of MOS transistor

W: gate width of MOS transistor

L: gate length of MOS transistor

Vth: threshold voltage of MOS transistor The above formulas (1), (2) indicate that MOSFET-C type filter is an integrating circuit having resistance Rds formed between the drain and source of MOS transistor and controlled by voltage Vx to be applied between the gate and source and time constant achieved by capacitance C. The above formulas (1), (2) hold only when the MOS transistor is caused operate in a triode region. FIG. 2 superimposes the triode region over Vgs-Ids characteristic of MOS transistor. FIGS. 3A and 3B show the triode region in an enlarged manner and a type of the drain-to-source resistance.

The drain-to-source resistance Rds of MOS transistor is a function of threshold voltage Vth, and such value is changed by ambient temperatures and variance in the manufacture of MOS transistor. For this reason, the passband of MOSFET-C type filter to be determined by the combination of the drain-to-source resistance Rds and capacitance C is also changed by the ambient temperatures and the variance in the manufacture of MOS transistor. Such change exceeds ±50% of a set target value. Because of such characteristic, the filters of the conventional configuration shown in FIGS. 1A, 1B cannot be used in those applications where a high accuracy in passband is required.

Shown in FIG. 4 is the configuration of a totally balanced Tow/Thomas type Biquad filter using the drain-to-source resistance of MOS transistor based on a similar operation principle (disclosed in (1) J. Tow, "Active RC Filters—a State—space Realization," Proc. IEEE, Vol. 56 pp1137–1139, 1968, (2) L. C. Thomas, "The Biquad: Part I—some Practical Design Consideration," IEEE Trans. Circuits and Syst., vol. CAS-18, pp 350–357, 1971, (3) T. C. Thomas, "Biquad: Part II:—A Multipurpose Active Filtering System," IEEE Trans. Circuits and Syst., Vol. CAS-18 pp. 358–361, 1971.).

In this filter, of the resistances in FIG. 5 for showing the principle of the biquad filter, the resistances Ra, Rb, Rc, Rd, except Rr to be used in producing inverting signal are replaced by the drain-to-source resistance Rdsan, Rdsap, Rdsbn, Rdsbp, Rdscn, Rdscp, Rdsdn, Rdsdp of MOS transistors Man, Map, Mbn, Mbp, Mcn, Mcp, Mdn, Mdp. The passband fc and Q-factor are expressed by formulas (3) to (11). It is to be noted that FIG. 4 includes the totally balanced operational amplifiers 521, 522; capacitance Can, Cap, Cbn, Cbp; control voltage source 523; and reference voltage source 524.

$$fc = 1/(2\pi \times Rdsb \times Rdsc \times Ca \times Cb) \quad (3)$$

$$Q = \sqrt{(Ca/Cb)} \times \{Rdsb^2/(Rdsc \times Rdsd)\} \quad (4)$$

$$Rdsx = 1/\{\mu n \times Cox \times W/L \times (Vx - Vth)\} \quad (5)$$

x: a, b, c, d (n, p)

$$Rdsap = Rdsan = Rdsa \quad (6)$$

$$Rdsbp = Rdsbn = Rdsb \quad (7)$$

$$Rdscp = Rdscn = Rdsc \quad (8)$$

$$Rdsdp = Rdsdn = Rdsd \quad (9)$$

$$Can = Cap = Ca \quad (10)$$

$$Cbp = Cbn = Cb \quad (11)$$

Like formulas (1), (2), the formulas (3) to (11) hold when all MOS transistors are caused to operate in the triode region. Formula (4) indicates that, unlike the passband given by formulas (1) and (2), Q of Biquad filter is determined by the ratio of capacitance and the ratio of drain-to-source resistance Rds between the plurality of MOS transistors. If this filter is used with setting a high Q-factor such as >4, the signal processing characteristic is affected by the capacitance obtained at an integrated circuit or by the variance to be determined by the ratio of the drain-to-source resistances of the plurality of MOS transistors.

As has been described above, MOSFET-C type filter shown in FIGS. 1A, 1B or in FIG. 4 has restrictions as follows:

① MOS transistors within the circuit must be operated in the triode region.

② The passband is shifted ±50% or more from the standard value due to ambient temperature and variance in the manufacture of MOS transistor.

③ Although Q-factor, when compared with the passband, is not likely to be affected by variance in the manufacture of transistor and temperatures, a small change in its value affects signal processing in a setting of Q>4.

A conventional automatic gain control circuits (AGC) will now be described. The automatic gain control circuits are used in various circuits including receiving circuits of communication equipment which require amplification of wide dynamic range signals, read circuit of magnetic or optical disk device, code reader devices, oscillation circuits, etc.

Shown in FIG. 6 is the configuration of automatic gain control circuit shown as an example in Japanese patent laid-open application Hei-6-208644. This automatic gain control circuit includes: amplifier circuit 552 including gain control means 551; feedback circuit 553; subtraction circuit 554; and instruction signal 555. The gain A thereof is determined as in formulas (12) and (13) by the internal circuits {operational amplifier 551a, MOS transistor 551b, resistors 551c (R1) and 551d (R2)} of the gain control means 551.

$$A = R2/R1 \times \{1/(1+R2/Rds)\} \quad (12)$$

$$Rds = 1/\{\mu n \times Cox \times W/L \times (Vgs - Vth)\} \quad (13)$$

μn: mobility of electron
Cox: capacitance of gate oxide film of MOS transistor
W: gate width of MOS transistor
L: gate length of MOS transistor
Vgs: gate-to-source voltage of MOS transistor
Vth: threshold voltage of MOS transistor The output voltage of the automatic gain control circuit (in stable state) becomes constant if the gain at the amplifier means 552 and at the feedback means 553 result in a sufficiently large negative-feedback loop. The gain of the system is determined by the characteristic of MOS transistor as indicated by formulas (12) and (13). For example, Vth (standard value 0.8V) varies ±0.1V or more due to variance in the manufacture. Such change becomes a cause of fluctuation in rise time and input voltage range.

SUMMARY OF THE INVENTION

It is an object of the present invention to provide a variable resistance circuit (the drain-to-source resistance of MOS transistor) capable of offsetting the variance in the manufacture of integrated circuits and the influence of ambient temperatures, and also to provide application circuits using the variable resistance circuit such as an integrating circuit, filter circuit, gain control circuit, and automatic gain control circuit.

To achieve the above object, there is provided a variable resistance circuit in accordance with the present invention, including: a control circuit having a plurality of constant-current output terminals, with a constant-current output ratio of the output terminals varied by electrical signals to be applied to a control terminal; an operational amplifier; a resistor; and a plurality of MOS transistors having the gates thereof connected in common. One output terminal of the control circuit is connected to one end of the resistor and to an inverted input terminal of the operational amplifier; the other output terminal of the control circuit is connected to the drain of one MOS transistor connected at the gate thereof to an output terminal of the operational amplifier and is connected to a non-inverted input terminal of the operational amplifier; the other end of the resistor and the source of said one MOS transistor are connected to a reference voltage terminal; said one MOS transistor is caused to operate in a triode region so as to use as an equivalent resistance the portion between the source and drain of the other MOS transistor which is connected at the gate thereof to the output terminal of the operational amplifier and at the source thereof directly or through a voltage copy circuit to the reference voltage terminal.

In thus constructed variable resistance circuit, the same voltage is applied between the respective gates and sources of the plurality of MOS transistors. This voltage is obtained in such a controlled state as to make equal to each other the drain-to-source resistance of one MOS transistor which serves as a reference and the resistance value (Re) of the resistor by the output current of the control circuit and by the operational amplifier. The portion between the drain and source of the other MOS transistor to which the voltage is applied between the gate and source becomes an equivalent resistance having a value Re/n (n: a positive constant determined by the control circuit).

Further, in the variable resistance circuit according to the invention, the control circuit can be controlled by digital signals to regulate the resistance value. Also, the resistor of the variable resistance circuit can be formed as a discrete resistor so that it is possible to implement the variable resistance circuit having the same temperature characteristic as such discrete resistor.

Furthermore, the variable resistance circuit according to the invention can be used to form an integrating circuit or filter circuit by implementing a voltage copy circuit between the inverted input terminal and non-inverted input terminal of an operational amplifier to which capacitor is connected between the output terminal and the inverted input terminal.

Further, a plurality of time constants are achieved by constructing the variable resistance circuit according to the invention as capable of obtaining a plurality of equivalent resistance and at the same time by providing the same number of units of operational amplifier and capacitor as the equivalent resistances. These can be combined to form a high-order filter circuit.

Further, the variable resistance circuit according to the invention can be constructed so as to obtain two equivalent resistances and these can be combined with a totally balanced operational amplifier and two capacitors to form a totally balanced integrating circuit or totally balanced filter.

Further, an inverting amplifier circuit consisting of resistor and operational amplifier can be combined with the variable resistance circuit according to the invention to form a gain control amplifier.

Further, a controlled system and feedback element can be combined with a control apparatus having a gain control amplifier formed by using the variable resistance circuit according to the invention as described above to construct an automatic gain control circuit.

Further, of the automatic gain control circuit, the controlled system can be a resonance motor which includes: a permanent magnet for providing a magnetic field; a scan mirror cyclically oscillated to reciprocatingly scan a laser beam in predetermined direction; an elastic member for supporting the scan mirror and for providing an oscillating drive; and a coil having two windings consisting of driving winding and detecting winding disposed adjacent to the permanent magnet.

Furthermore, the variable resistance circuit according to the invention can be used to achieve a photoelectric current detecting circuit such that a voltage copy circuit is constructed by two inverting amplifiers of identical construction, a constant-current source connected to the input of one of the inverting amplifiers, and resistor connected between the input and output of said one inverting amplifier and that one terminal of the variable resistance circuit is connected to the output terminal of the other inverting amplifier and that the other terminal of the variable resistance circuit and a light detecting device are connected to the input terminal of the other inverting amplifier.

DESCRIPTION OF THE PREFERRED EMBODIMENTS

Figure 1A:
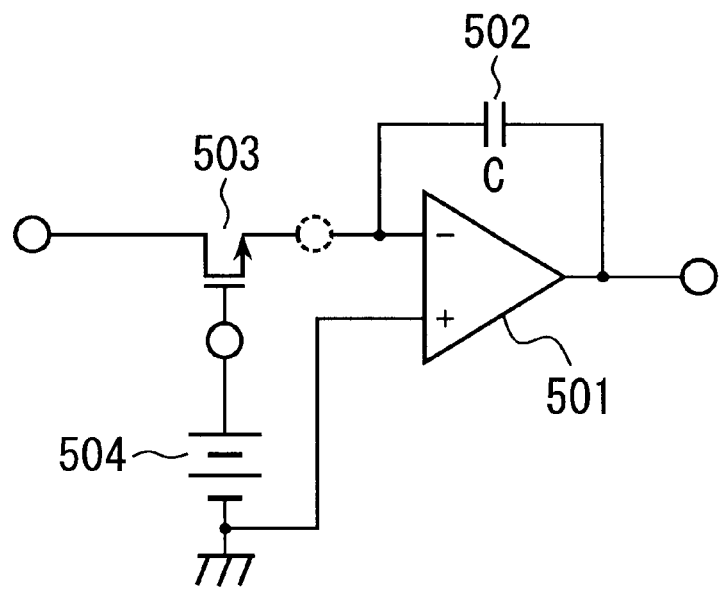
FIGS. 1A and 1B are circuit diagrams each showing a typical configuration of MOSFET-C type filter.
Figure 1B:
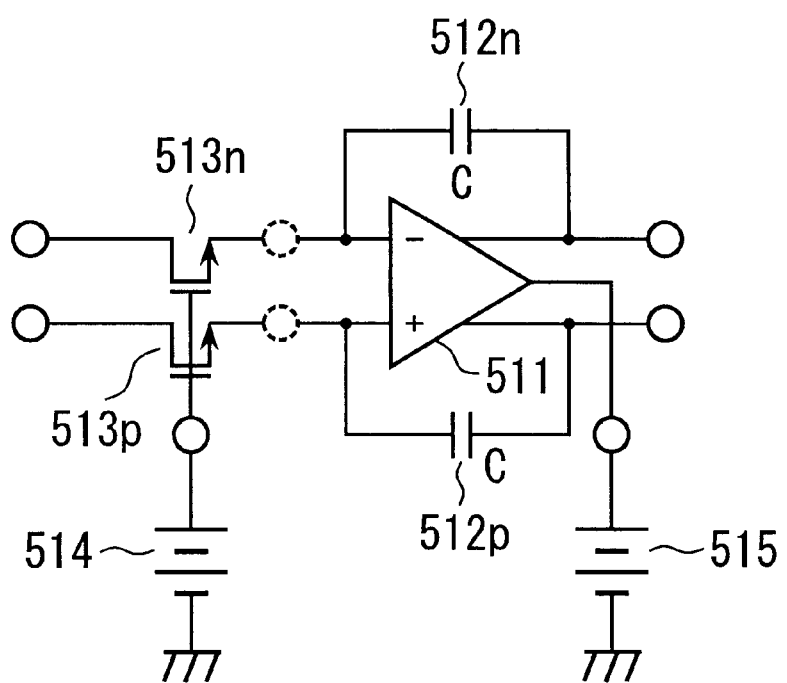
Figure 2:
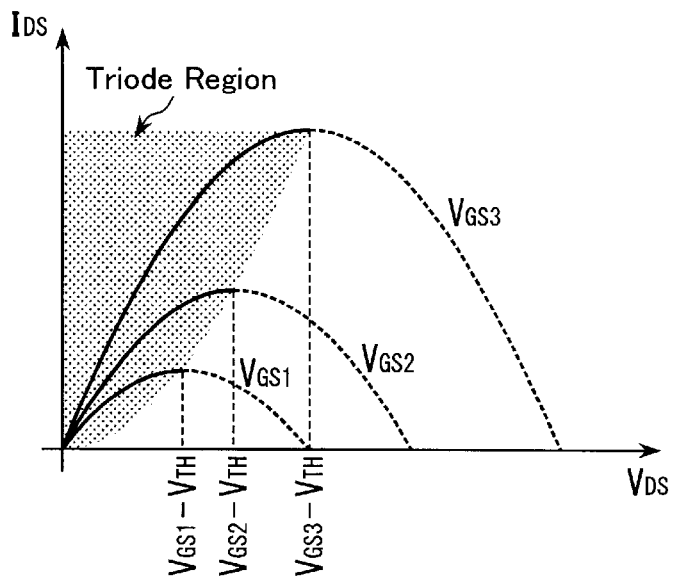
FIG. 2 indicates a triode region over Vgs-Ids characteristic of MOS transistor.
Figure 3A:
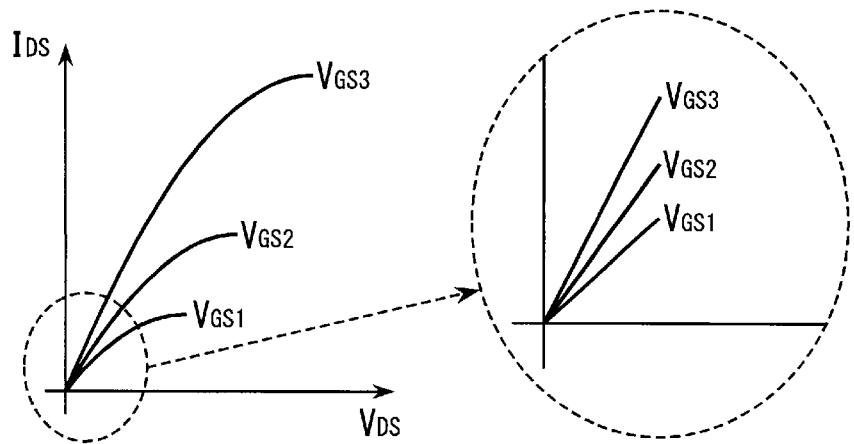
FIGS. 3A and 3B show the triode region shown in FIG. 2 in an enlarged manner and a type of the drain-to-source resistance of MOS transistor.
Figure 3B:
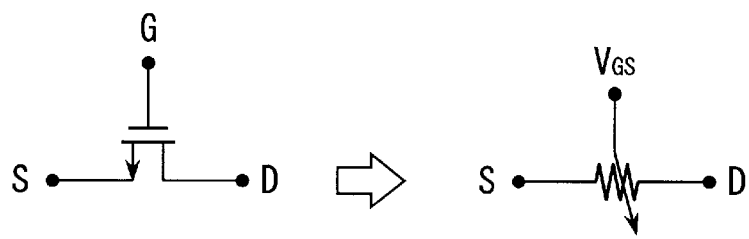
Figure 4:
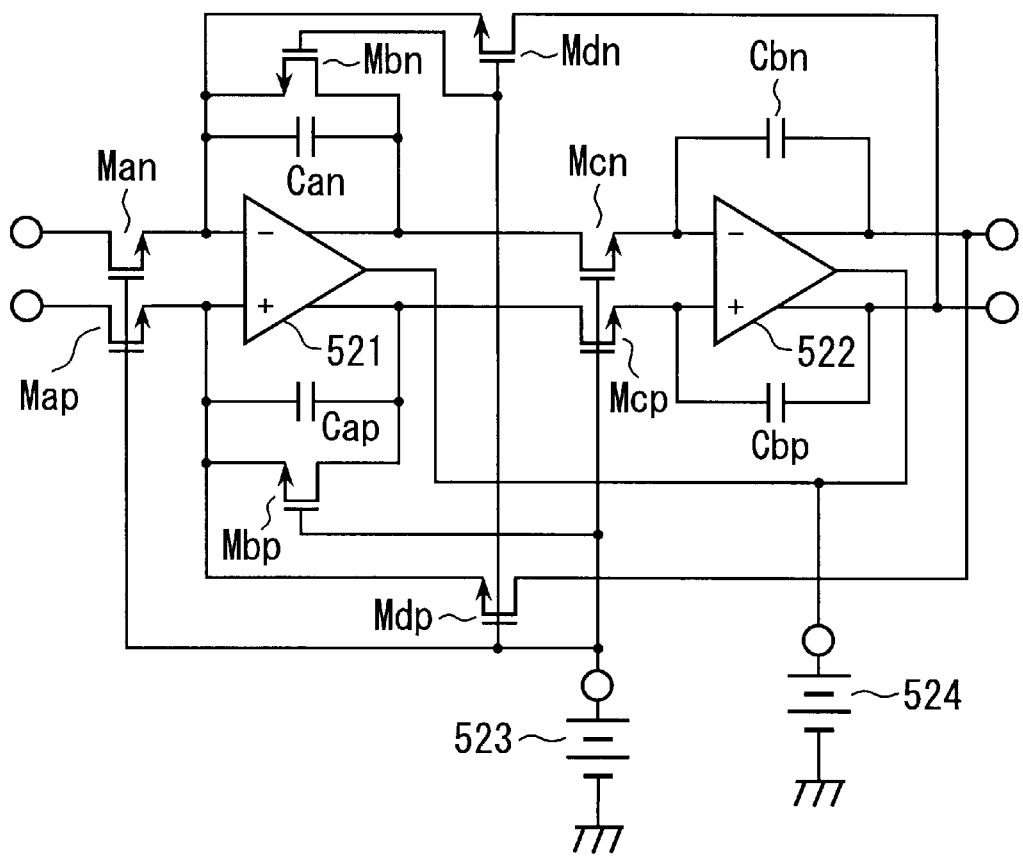
FIG. 4 is a circuit diagram showing a conventional totally balanced biquad filter.
Figure 5:
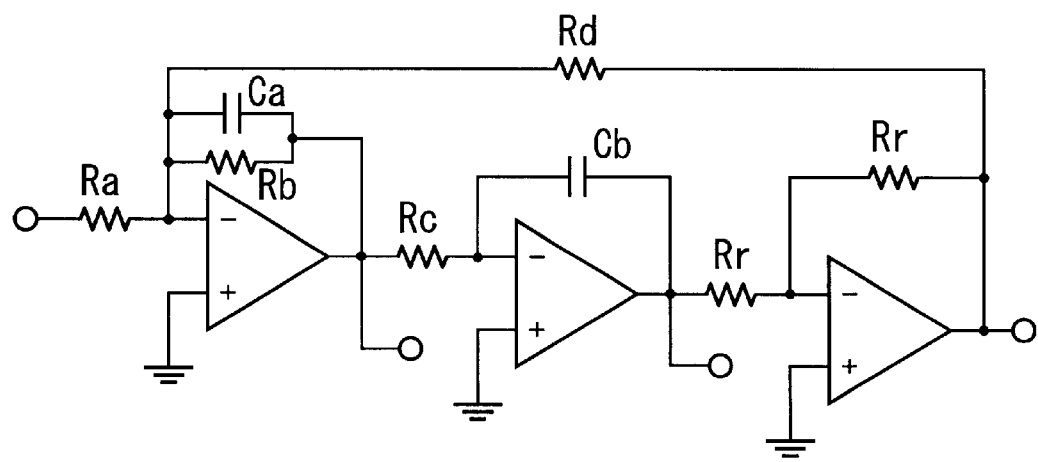
FIG. 5 is a circuit diagram showing the principle of biquad filter.
Figure 6:
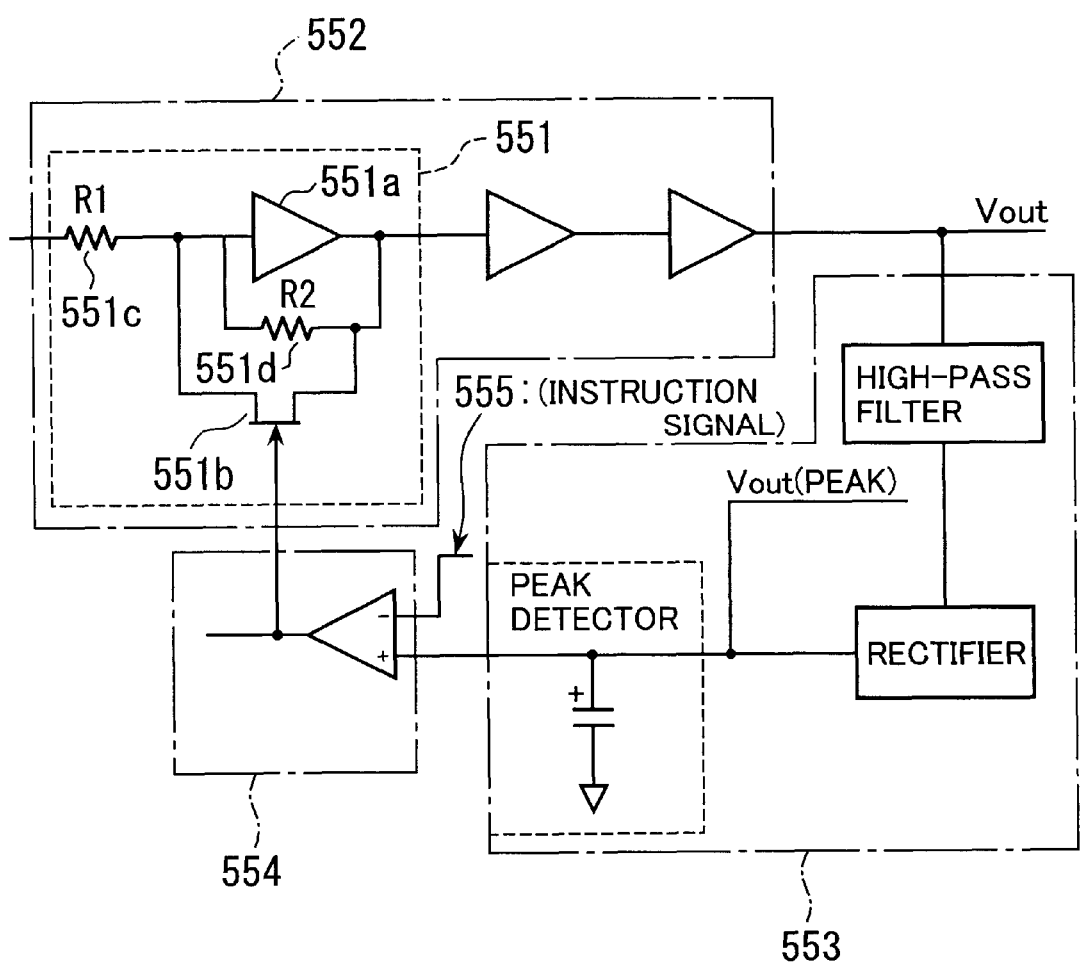
FIG. 6 is a circuit diagram showing a typical configuration of conventional automatic gain control circuit.
Figure 7A:
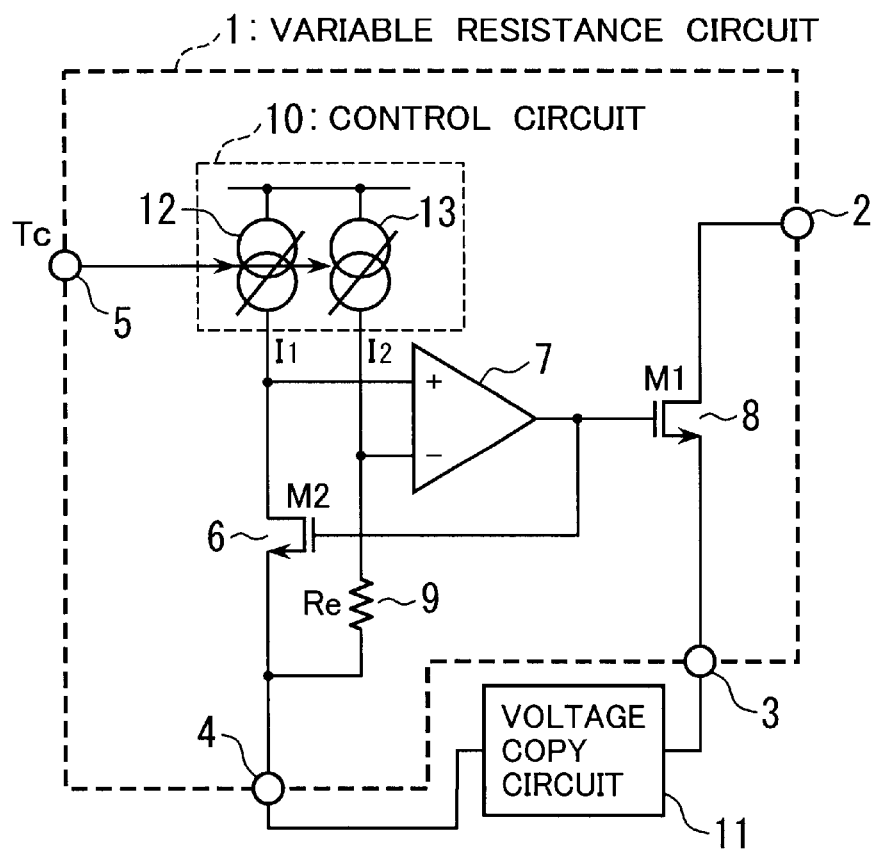
FIGS. 7A and 7B are circuit diagrams showing a first embodiment of the variable resistance circuit according to the present invention and a modification thereof.
Figure 7B:
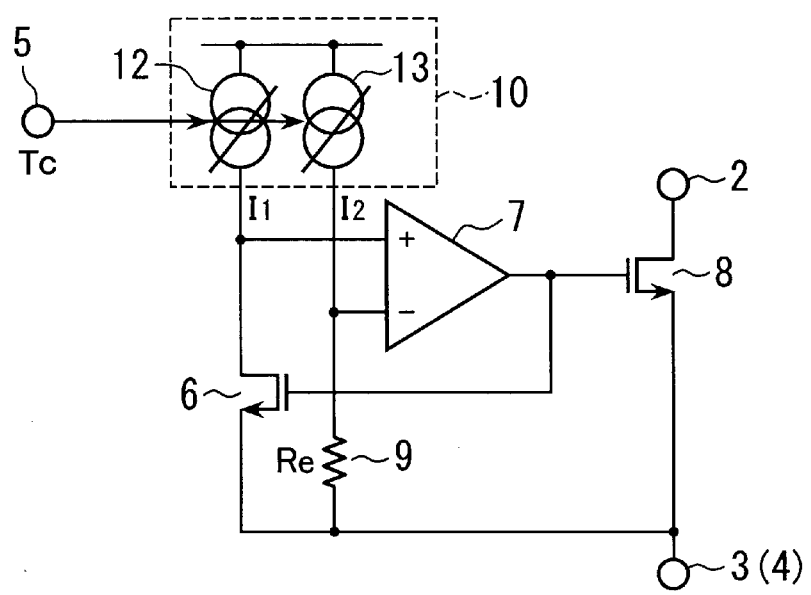

Some embodiments of the present invention will now be described with reference to the drawings. FIGS. 7A and 7B are circuit diagrams showing a first embodiment of the variable resistance circuit according to the invention and a modification thereof. The variable resistance circuit according to this embodiment includes: a control circuit 10 having two constant-current sources 12, 13 of which output current ratio is caused to vary by an electrical signal Tc to be applied to a control terminal 5; an operational amplifier 7; a resistor 9 serving as reference; and two MOS transistors 6, 8 having their gates connected in common.

One constant-current source 13 of the control circuit 10 is then connected to the resistor 9 and to an inverted input terminal of the operational amplifier 7. The other constant-current source 12 of the control circuit 10 is connected to the drain of one MOS transistor 6 connected at the gate thereof to the output terminal of the operational amplifier 7 and is connected to a non-inverted input terminal of the operational amplifier 7. The other end of the resistor 9 and the source of said MOS transistor 6 are connected to a reference voltage terminal 4. In the embodiment shown in FIG. 7A, then, the portion between the source and drain of the other MOS transistor 8 is caused to operate as an equivalent resistance in the state where the source thereof is connected to the output terminal of a voltage copy circuit 11 to the input terminal of which the voltage occurring at the reference voltage terminal 4 is connected. Further, in the modification shown in FIG. 7B, the portion between the source and drain of the other MOS transistor 8 is caused to operate as an equivalent resistance in the state where the reference voltage terminal 4 is directly connected to the source. It should be noted that, in FIGS. 7A, 7B, numerals 2 and 3 denote output terminals of the equivalent resistance between the source and drain of MOS transistor 8.

At this time, output currents $I_1$, $I_2$ from the constant-current sources 12, 13 of the control circuit 10 and resistance value Re of the resistor 9 are set such that the one MOS transistor 6 is caused to operate in the triode region. The voltage copy circuit 11 shown in FIG. 7A has high impedance and obtains a voltage at which the output is equal to the input. An example corresponding to this is the portion between the non-inverted input terminal and inverted input terminal of an operational amplifier which is subjected to negative feedback. Of the operational amplifier, when caused to operate as a negative-feedback system, voltages at the non-inverted terminal and inverted terminal become equal to each other due to the theory of virtual-short circuit. This corresponds to a voltage copy circuit where the non-inverted terminal serves as input and the inverted terminal as output.

When formula (14) holds of the output currents $I_1$, $I_2$ of the control circuit 10 (n: positive integer), formula (15) also holds between the drain-to-source resistance Rds (M2) of MOS transistor 6 and the resistor 9 (Re).

$$I_1 = n \times I_2 \tag{14}$$

$$n \times I_2 \times Rds(M2) = I_2 \times Re \tag{15}$$

Rds shown in formula (15) is expressed by formula (2) which has been indicated in the description of the conventional example, and Vx of formula (2) is the output voltage of the operational amplifier 7 in the case of the variable resistance circuit according to this embodiment.

The output voltage of the operational amplifier 7 is applied also to the gate of the other MOS transistor 8. Since the same voltage as the source terminal of MOS transistor 6 is applied through the voltage copy circuit 11 or directly to the source terminal of MOS transistor 8, the drain-to-source resistance Rds(M1) of MOS transistor 8 is given by formula (16).

$$Rds(M1)=I_2 \times Re/(n \times I_2)Re/n \quad (16)$$

Accordingly, by changing ratio "n" between the output currents 11 and 12 through the electrical signal Tc to be applied to the control terminal 5, the variable resistance circuit according to this embodiment operates as an equivalent resistance circuit which has the same temperature characteristic as the resistor 9 and of which the resistance value can be regulated by the electrical signal Tc on the control terminal 5. This variable resistance circuit premises an implementation of all the circuits including the two transistors (M1) 8 and (M2) 6 on the same one silicon chip. Since mismatch between the transistors formed within the same silicon chip is very small, an error is small in deriving formula (3) from formula (2).

Figure 8:
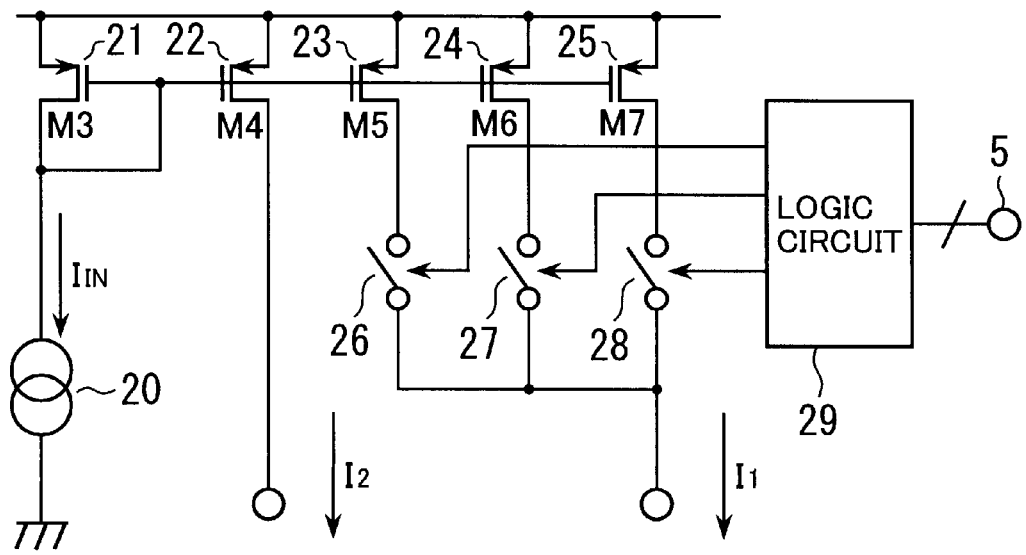
FIG. 8 is a circuit diagram showing the configuration of the portion of the control circuit in a second embodiment according to the invention.

A second embodiment of the invention shown in FIG. 8 will now be described. In this embodiment, the control circuit 10 in the first embodiment includes: a current mirror circuit having a plurality of outputs [MOS transistors (M3) 21, (M4)22, (M5)23, (M6)24, (M7)25, and constant-current source 20]; a plurality of switches [SW(1) 26, SW(2)27, SW(3)28] for effecting ON/OFF of the output of the current mirror circuit; and a logic circuit 29 receiving as input the digital signals applied as the electrical signal Tc on the control terminal 5 to control the plurality of switches.

Here, of the plurality of current outputs corresponding to the output of the control circuit 10, one is the output $I_2$ of a current mirror obtained by returning the input current, i.e. drain current of transistor (M4)22. The other is the current $I_1$ added by connecting a plurality of outputs [drain currents of MOS transistors (M5)23, (M6) 24, (M7)25] of current mirror obtained similarly by returning the input current to those ends of the switches [SW(1)26, SW(2)27, SW(3)28] of which the other ends are connected in common. Each switch is controlled by the digital signals to be applied to the control terminal 5 which is input to the logic circuit 29 so that the added current $I_1$ is outputted from the terminal of the side connected in common.

Supposing the relationship as shown in formulas (17) and (18) among the gate widths W and gate lengths L of MOS transistors (M5)23, (M6)24, (M7)25 and (M4)22:

$$M4(L)=M5(L)=M6(L)=M7(L) \quad (17)$$

$$M4(W):M5(W):M6(W):M7(W)-1:1:2:4 \quad (18)$$

the output currents $I_1$, $I_2$ of the control circuit are given by formulas (19) and (20) when switches SW(1)26, SW(2)27, SW(3)28 are switched by the logic circuit 29. Here the current of the constant-current source 20 is determined as $I_{1N}$.

$$I_2=I_{1N} \quad (19)$$

$$I_1=a \times I_{1N}(a: \text{an integer 1 to 7}) \quad (20)$$

Figure 9:
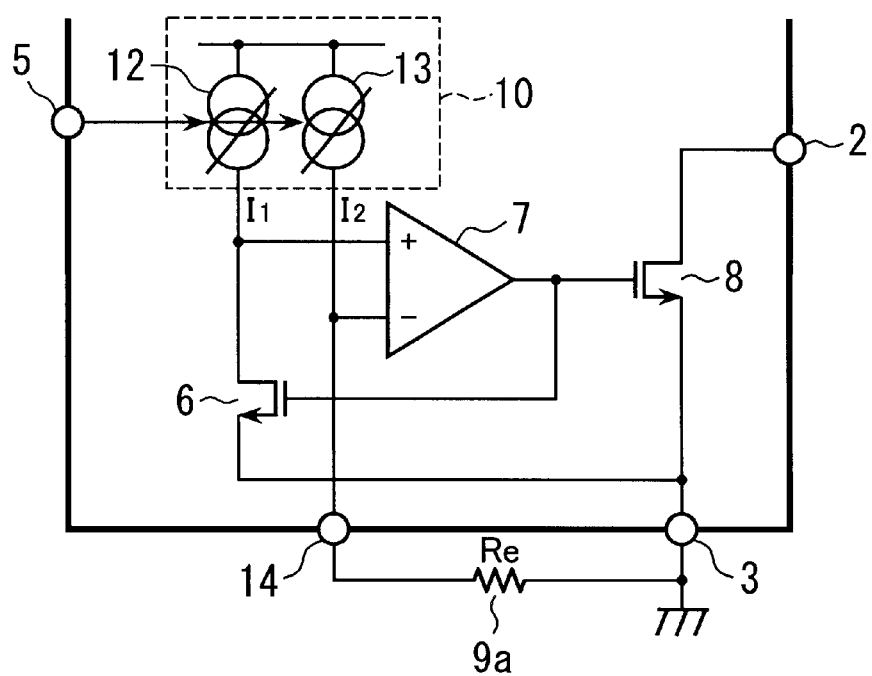
FIG. 9 is a circuit diagram showing a third embodiment according to the invention.

A third embodiment of the invention shown in FIG. 9 will now be described. In this embodiment, of the variable resistance circuit as shown in FIG. 7B where one terminal 3 of the equivalent resistance, i.e. the source of MOS transistor 8 and the reference voltage terminal 4 of the variable resistance circuit described in relation to the first embodiment are connected in common into one, the resistance 9 alone is constructed as a discrete resistor 9a outside the integrated circuit. While the equivalent resistance of the variable resistance circuit according to this embodiment is expressed by formula (16) as has been described in the first embodiment, this construction makes it possible to achieve a variable resistance circuit where the discrete resistance 9a having high absolute precision and low temperature coefficient is used as a reference instead of a resistor within the integrated circuit which generally has low absolute precision and large temperature coefficient. In FIG. 9, numeral 14 denotes a connecting terminal of the discrete resistance 9a.

Figure 10:
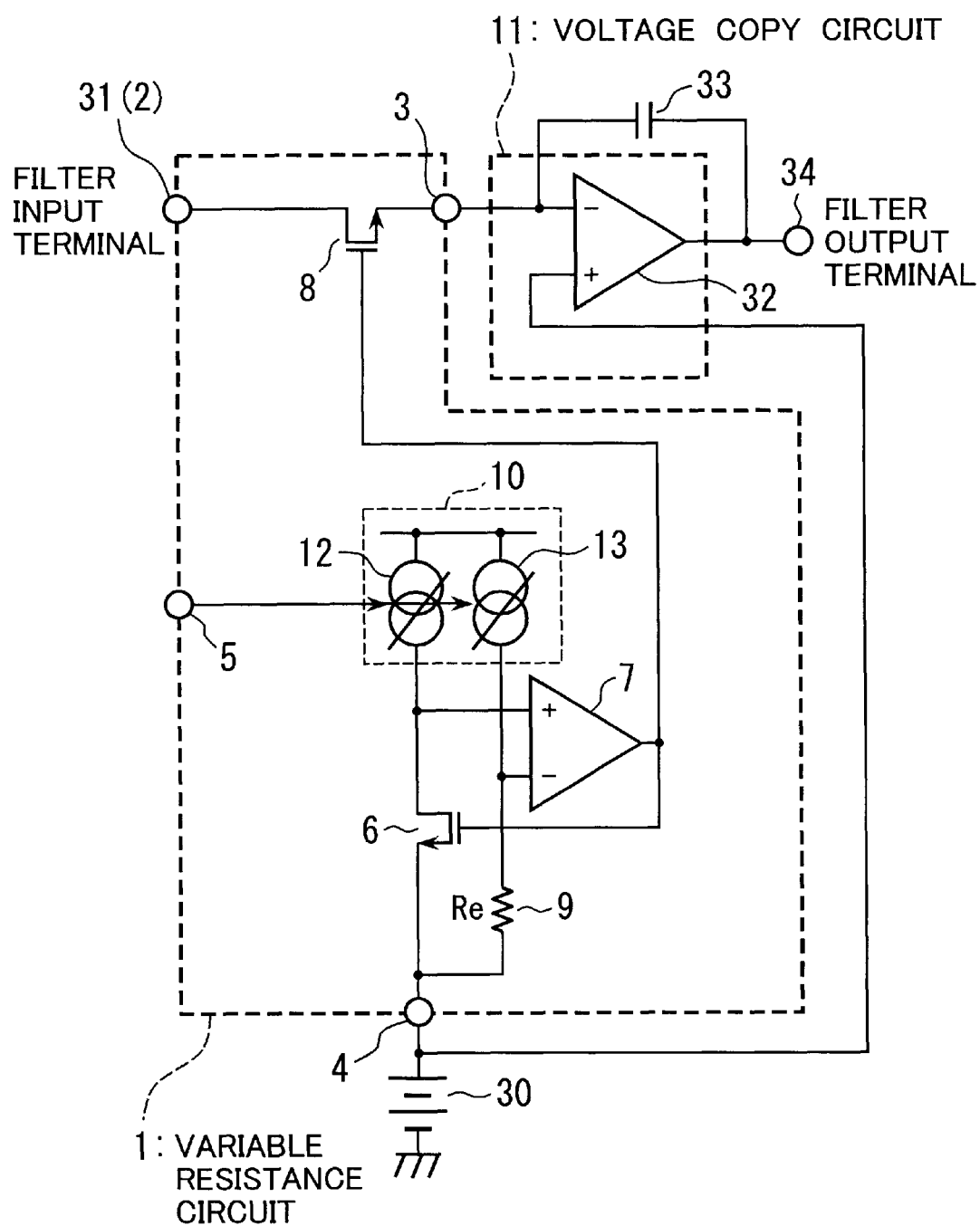
FIG. 10 is a circuit diagram showing an integrating circuit or filter circuit constructed by using the variable resistance circuit according to a fourth embodiment of the invention.

A fourth embodiment of the invention shown in FIG. 10 will now be described. This embodiment relates to an integrating circuit or filter circuit using the variable resistance circuit described in the first embodiment as shown in FIG. 7A (the type bringing the equivalent resistance terminal 3 and the reference voltage terminal 4 to the same electric potential by means of the voltage copy circuit 11).

In particular, a reference voltage source 30 and the non-inverted terminal of a second operational amplifier 32 are connected to the reference voltage terminal 4 of the variable resistance circuit 1, and the inverted terminal of the operational amplifier 32 and one end of capacitor 33, connected at the other end thereof to the output terminal of the operational amplifier 32, are connected to the source terminal 3 of MOS transistor 8 which is one terminal of the equivalent resistance.

In thus constructed integrating circuit or filter circuit, since the second operational amplifier 32 operates in the condition of a negative feedback, the non-inverted terminal and inverted terminal are brought to the same electrical potential due to the theory of virtual-short circuit. The second operational amplifier 32 serves as the voltage copy circuit 11, and at the same time the circuit combining the second operational amplifier 32 and the variable resistance circuit forms an integrating circuit or active filter circuit having an input terminal 31 rendered by the terminal 2 of the equivalent resistance and an output terminal 34 rendered by the output terminal of the second operational amplifier 32, and having the product of the equivalent resistance and capacitor 33 as time constant.

Figure 11:
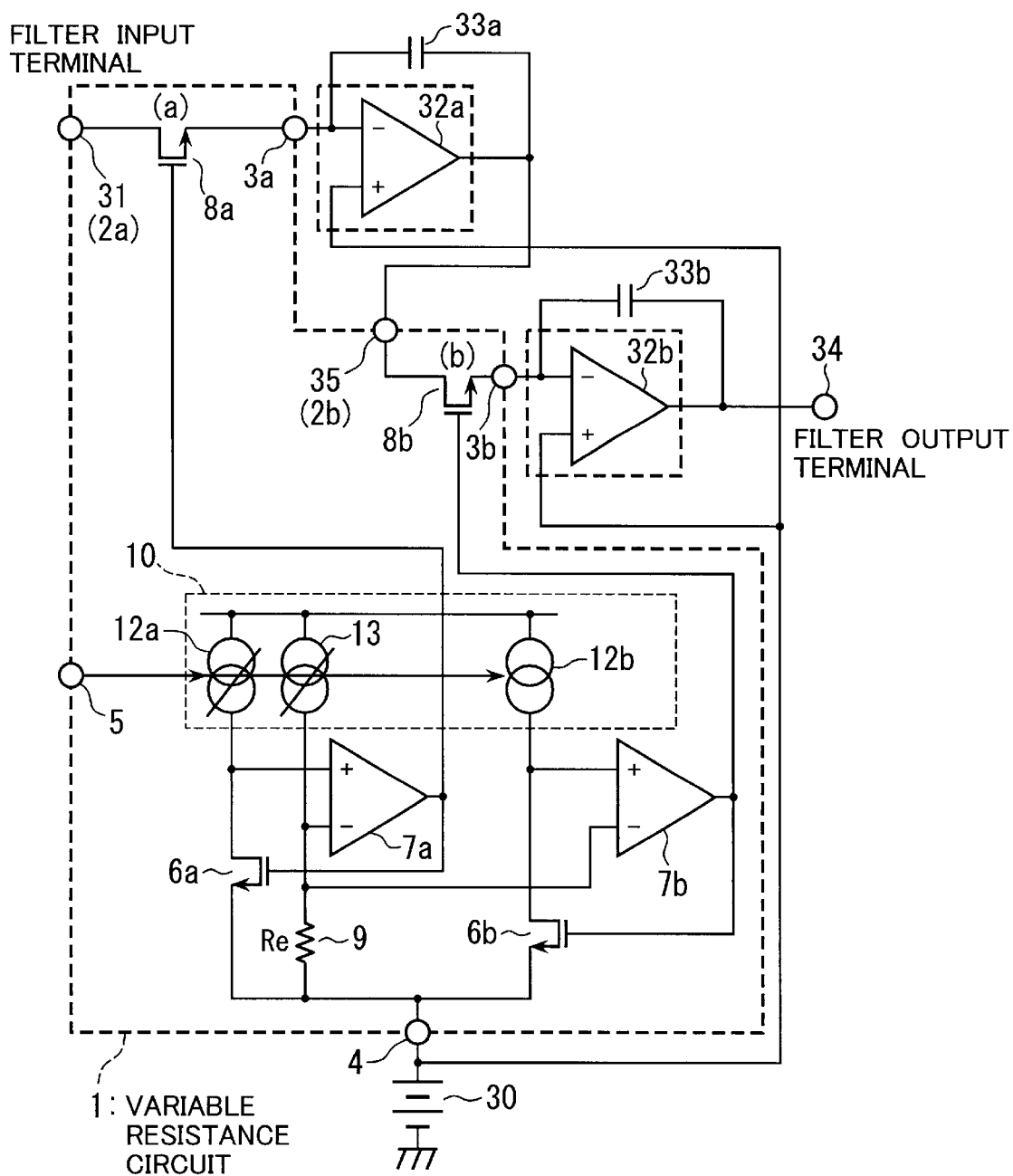
FIG. 11 is a circuit diagram showing a high-order filter circuit constructed by using the variable resistance circuit according to a fifth embodiment of the invention.

A fifth embodiment of the invention shown in FIG. 11 will now be described. This embodiment relates to high-order filter circuit using the variable resistance circuit described in the first embodiment as shown in FIG. 7A (the type bringing the equivalent resistance terminal 3 and the reference voltage terminal 4 to the same electrical potential by means of the voltage copy circuit 11).

In particular, the variable resistance circuit includes: control circuit 10 having three constant-current sources 12a, 12b, 13; two operational amplifiers 7a, 7b; resistor 9; and four MOS transistors 6a, 6b, 8a, 8b. It has two variable equivalent resistances a, b (denoted by suffixes a, b added to respective related component parts) on the basis of the resistor 9 which serves as a reference. Here, the reference voltage source 30 and the non-inverted terminals of two second operational amplifiers 32a, 32b are connected to the reference voltage terminal 4. The inverted terminals of the operational amplifiers 32a, 32b and one end of capacitors 33a, 33b, connected at the other end thereof to the output terminals of the respective operational amplifiers 32a, 32b, are connected to the source terminal sides 3a, 3b of MOS transistors 8a, 8b which are each one terminal of an equivalent resistance. Further, the output of one second operational amplifier 32a is connected to the drain terminal 35 of MOS transistor 8b which is one terminal of a variable equivalent resistance.

In thus constructed circuit, since the second operational amplifiers 32a, 32b operate in the condition of a negative feedback, the non-inverted terminals and inverted terminals are brought to the same electrical potential due to the theory of virtual-short circuit. The second operational amplifiers 32a, 32b serve as the voltage copy circuit 11, and at the same time the circuit combining the two second operational amplifier 32a, 32b and the variable resistance circuit of the above described construction forms an active filter circuit having an input terminal 31 rendered by the drain terminal of MOS transistor 8a becoming terminal 2a of equivalent resistance and an output terminal 34 rendered by the output terminal of the other second operational amplifier 32b, and having as time constants the product of equivalent resistance "a" and capacitor 33a and the product of equivalent resistance "b" and capacitor 33b.

Figure 12:
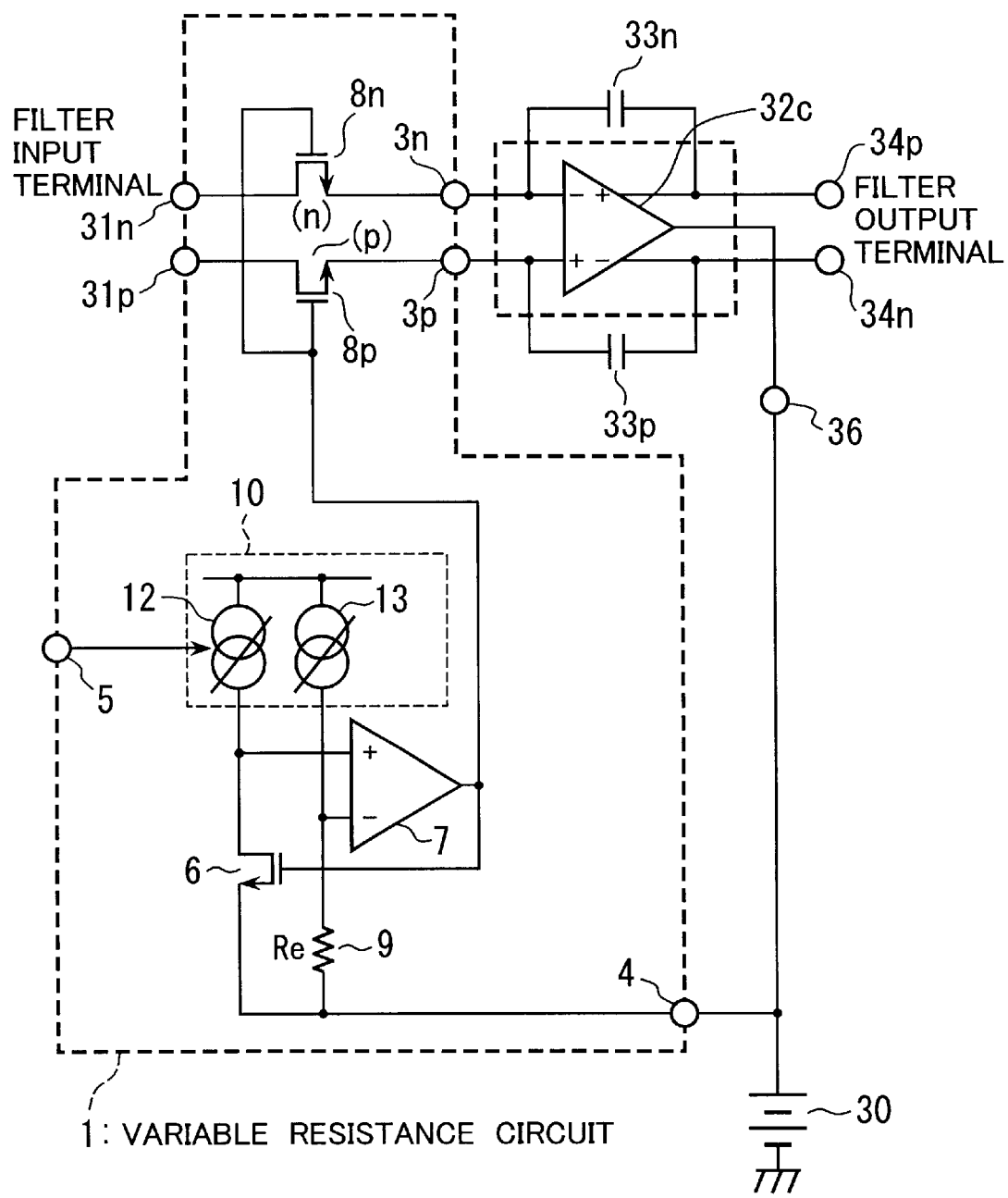
FIG. 12 is a circuit diagram showing a totally balanced filter circuit constructed by using the variable resistance circuit according to a sixth embodiment of the invention.

A sixth embodiment of the invention shown in FIG. 12 will now be described. This embodiment relates to a totally balanced filter circuit using the variable resistance circuit described in the first embodiment as shown in FIG. 7A (the type bringing the equivalent resistance terminal 3 and the reference voltage terminal 4 to the same electrical potential by means of the voltage copy circuit 11).

In particular, the variable resistance circuit in this embodiment includes three MOS transistors 6, 8p, 8n. It has two equivalent variable resistances p, n implemented by the three MOS transistors 6, 8p, 8n. Here, the reference voltage source 30 and the common-mode terminal 36 of a totally balanced operational amplifier 32c are connected to the reference voltage source 4. The source terminals 3p, 3n of MOS transistors 8p, 8n which are each one terminal of an equivalent resistance, are respectively connected to the non-inverted input terminal and inverted input terminal of the totally balanced operational amplifier 32c and also to one end of capacitor 33p connected at the other end thereof to the negative output terminal of the totally balanced operational amplifier 32c and to one end of capacitor 33n connected at the other end thereof to the positive output terminal of the same.

In thus constructed circuit, the common-mode terminal, non-inverted input terminal and inverted input terminal are brought to the same electrical potential due to the common-mode feedback function of the totally balanced operational amplifier 32c. The totally balanced operational amplifier 32c serves as the voltage copy circuit 11, and at the same time the circuit combining the totally balanced operational amplifier 32c and the variable resistance circuit of the above described construction forms a totally balanced integrating circuit or totally balanced active filter circuit having input terminals 31p, 31n rendered by the terminals of equivalent resistance, i.e. drain terminals of MOS transistors 8p, 8n and output terminals 34p, 34n rendered by the output terminals of the totally balanced operational amplifier 32c, and having the product of equivalent resistances p, n and capacitors 33p, 33n as time constants.

A seventh embodiment of the invention shown in FIG. 13 will now be described. This embodiment relates to a gain control amplifier using the modification of the first embodiment shown in FIG. 7B, i.e. the variable resistance circuit 1 where the reference voltage terminal 4 is directly connected to the source terminal 3 of MOS transistor 6 which acts as an equivalent resistance.

In particular, this embodiment is constructed by adding a resistor 101 and an operational amplifier 102 to the variable resistance circuit 1. A reference voltage terminal 4 to become one terminal 3 of the equivalent resistance of the variable resistance circuit 1 is connected to GND. The drain of MOS transistor 8 to become the other terminal 2 of the equivalent resistance and one end of the resistor 101 are connected to the inverted input terminal of the operational amplifier 102. The other end of resistor 101 is connected to the output terminal of the operational amplifier 102. A gain control amplifier for controlling (regulating) the gain of the circuit by electrical signals to be inputted to the control terminal 5 of the variable resistance circuit 1 is then constructed as having an input terminal rendered by the non-inverted input terminal of the operational amplifier 102 and an output terminal rendered by the output terminal of the operational amplifier 102.

The operation of the gain control amplifier according to this embodiment will now be described. The equivalent resistance value of the variable resistance circuit 1 is varied by a gain control signal as the electrical signal Tc to be applied to the control terminal 5. The gain Vo/Vin of the circuit is determined by the ratio between the equivalent resistance value RA of the variable resistance circuit 1 and resistance value RB of the resistor 101 and is given by formula (21), since the equivalent resistance of the variable resistance circuit 1 is expressed by formula (16).

$$Vo/Vin = R_B/R_A = R_B/(I_2/I_1 \cdot Re) = R_B/(Re/n) \quad (21)$$

As can be seen from formula (21), the gain of the circuit is caused to vary by electrical signals to be applied to the control terminal 5 of the control circuit 10 of the variable resistance circuit 1 and is controlled (regulated) by "n" in formula (21). Further, formula (21) indicates that the gain of the circuit does not depend on the characteristic of MOS transistor. The operational amplifier 102 and resistor 101 as described herein can be integrated on the same one chip as the variable resistance circuit 1.

Figure 13:
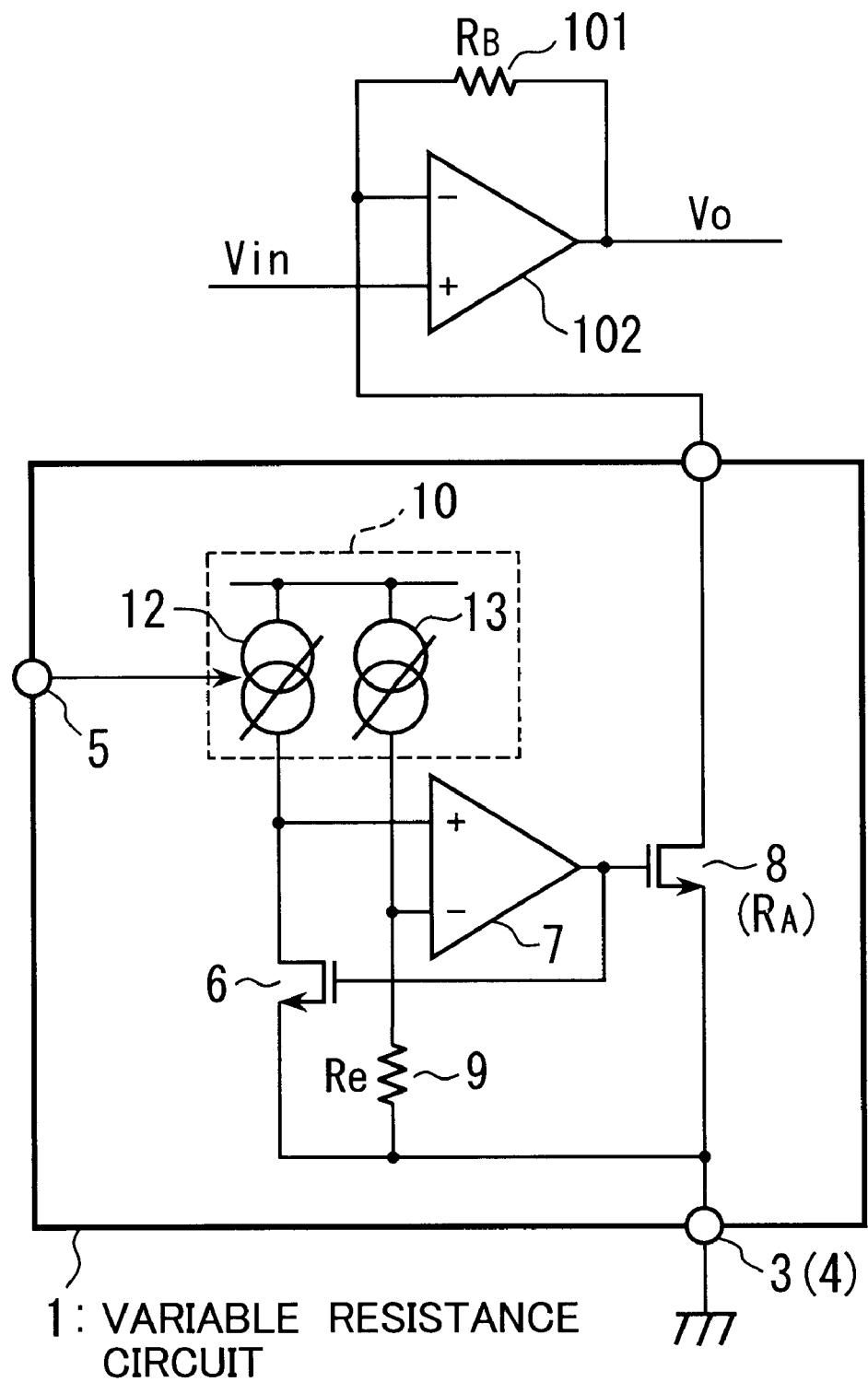
FIG. 13 is a circuit diagram showing a gain control amplifier constructed by using the variable resistance circuit according to a seventh embodiment of the invention.

In the seventh embodiment shown in FIG. 13, the operational amplifier 102 forms a non-inverting amplifier circuit. An inverting amplifier circuit having a similar gain controlling (regulating) function however is constructed such that, instead of the type where the reference voltage terminal 4 and the terminal 3 of the equivalent resistance, i.e. the source of MOS transistor 8 are directly connected to each other as shown in FIG. 7B, the variable resistance circuit 1 is formed as the type constructed to have the two terminals divided as shown in FIG. 7A so as to cause the portion between the inverted input terminal and non-inverted input terminal of the operational amplifier 102 to function as a voltage copy circuit.

Figure 14:
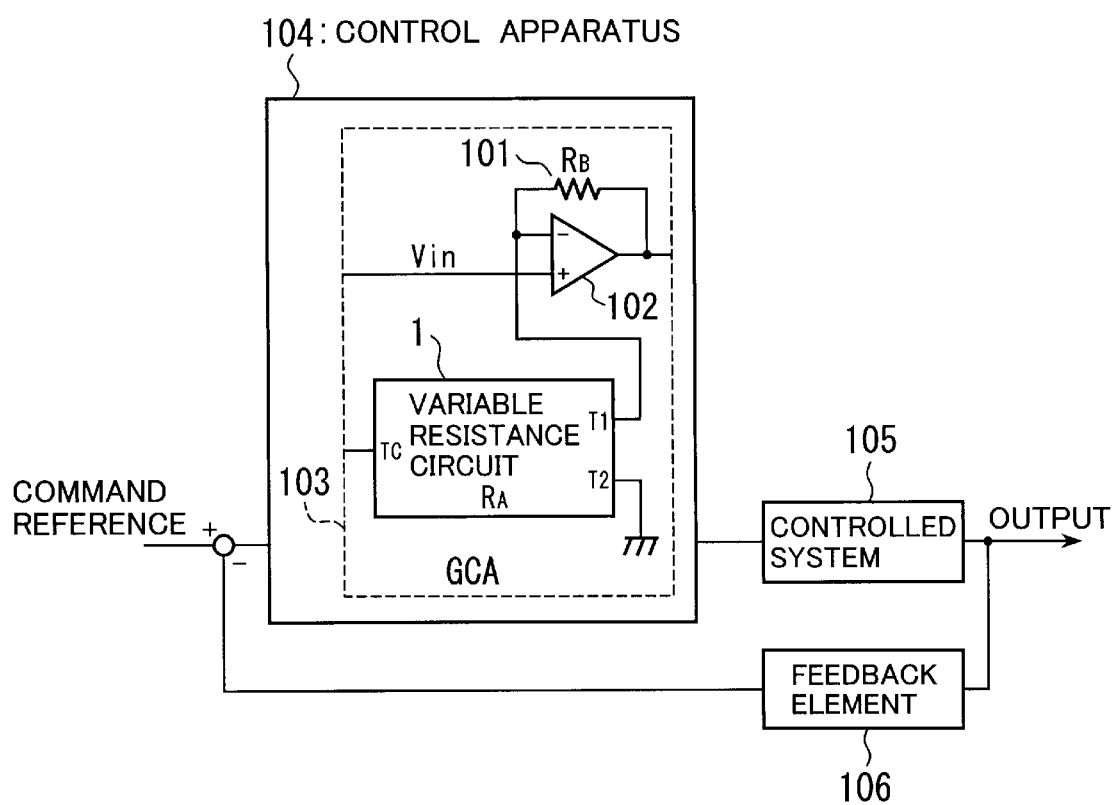
FIG. 14 is a circuit diagram showing an automatic gain control circuit of an eighth embodiment constructed by using the gain control amplifier shown in FIG. 13.

An eighth embodiment of the invention shown in FIG. 14 will now be described. This embodiment relates to an automatic gain control circuit using the gain control amplifier (GCA) shown in FIG. 13. In particular, the automatic gain control circuit includes: a control apparatus 104 including a gain control amplifier (GCA) 103 as shown in FIG. 13; a controlled system 105; and a feedback element 106.

The automatic gain control circuit according to this embodiment is furnished with a negative feedback so that an output thereof is controlled to a certain value. Further, a command reference of the output is applied to a stage previous to the control apparatus 104. In this embodiment, a system for controlling the gain of the circuit, i.e. automatic gain control circuit is formed as the system for performing the above described control. The gain control amplifier (GCA) 103 controls the gain in this automatic gain control circuit.

The gain control amplifier (GCA) 103 in this embodiment is of the same circuit configuration as that shown in the seventh embodiment. Accordingly, an automatic gain control circuit without depending on the characteristic of MOS transistor can be achieved by using the gain control amplifier (GCA) 103. In those cases where, for example, an absolute variance value of IC is previously written to a non-volatile memory so as to control an output to a certain value by reading such data when the circuit is in operation, the number of data to be written to the non-volatile memory can be reduced by using this automatic gain control circuit. As has been described, according to the eighth embodiment of the invention, an automatic gain control circuit not depending on the characteristic of MOS transistor can be constructed.

A ninth embodiment shown in FIG. 15 will now be described. In this embodiment, the controlled system of the automatic gain control circuit shown in FIG. 14 is a resonance motor. It includes a resonance motor 109, and a motor drive circuit 110 using the gain control amplifier (GCA) 103 shown in FIG. 13.

Figure 16:
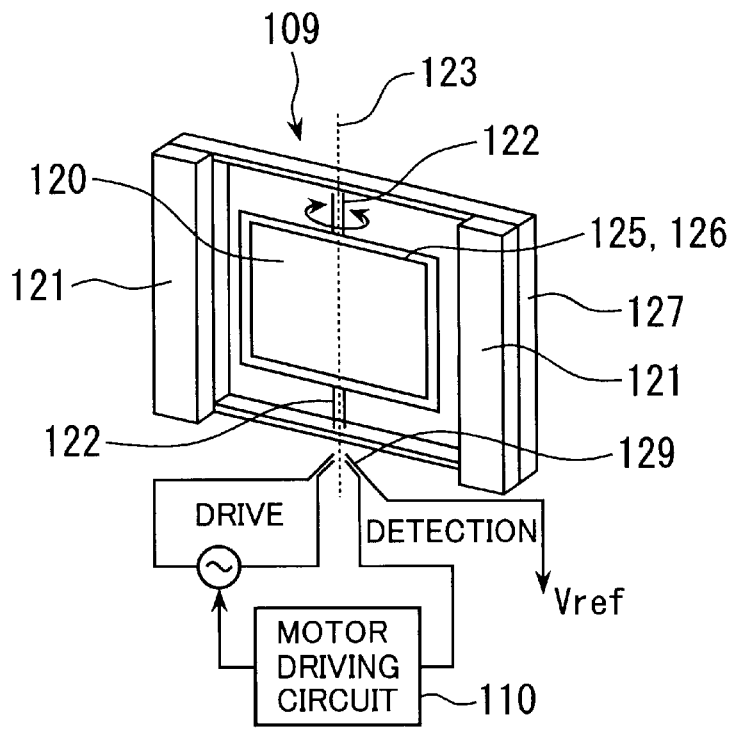
FIG. 16 shows a typical configuration of resonance motor.

The resonance motor 109 has permanent magnets 121 disposed at two ends of a rectangular frame-like supports 127 as shown in FIG. 16, and a moving plate 120 is supported so as to be rotatable by means of elastic members 122 at the upper and lower ends (the sides without permanent magnets 121) within the frame. A driving coil 125 and detecting coil 126 are formed on one surface of the moving plate 120. The resonance motor 109 is then provided with a motor driving circuit 110 which controls the power supply on the basis of a signal that depends on deflection angle detected by the detecting coil 126 so as to flow a desired current to the driving coil 126. A resonance motor of this type is referred to as moving coil type motor, and the moving plate 120 constitutes a scan mirror for scanning a laser beam in a reciprocating manner along predetermined direction. It is to be noted that, in FIG. 16, numeral 123 denotes a rotating axis and 129 denotes a port for fetching signal.

Figure 17:
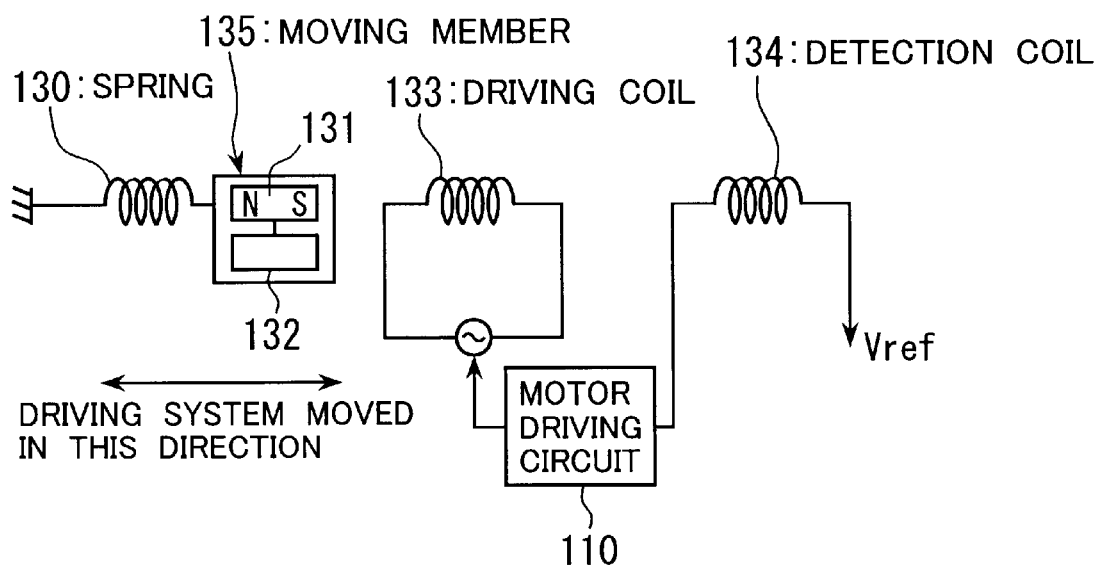
FIG. 17 shows another example of configuration of resonance motor.

Further, a moving magnet type motor as shown in FIG. 17 is known as resonance motor of a different configuration. In the resonance motor of this type, a moving member 135 having a permanent magnet 131 and a mirror 132 for scanning laser beam mounted thereon is provided at one end of a spring 130 of which the other end is fixed. Provided in the vicinity of the moving member 135 are a driving coil 133 for driving the moving member 135 and a detecting coil 134 wound on the same bobbin as the driving coil 133. Further there is provided a motor driving circuit 110 which controls the power supply on the basis of a signal that depends on deflection angle detected by the detecting coil 134 so as to flow a desired current to the driving coil 133.

Figure 15:
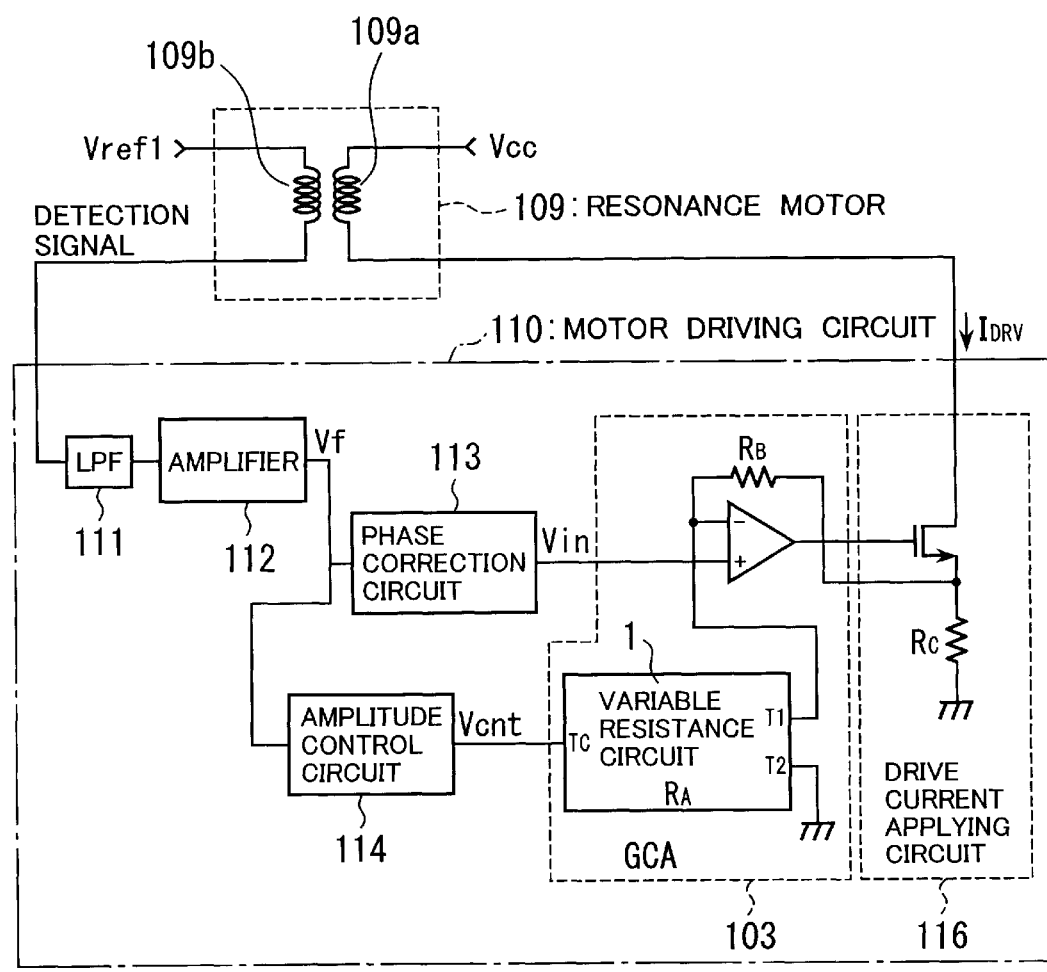
FIG. 15 is a circuit diagram showing an automatic gain control circuit of a ninth embodiment where the controlled system is a resonance motor in the automatic gain control circuit shown in FIG. 14.

Shown in the ninth embodiment of FIG. 15 are only a motor driving circuit 110, and a driving coil 109a and detecting coil 109b of the resonance motor 109 which have electrical interface. The configuration of the motor driving circuit 110 will now be described. The motor driving circuit 110 is the circuit for driving the resonance motor 109 and in this embodiment is subjected to a feedback control so that the resonance motor 109 attains a predetermined deflection angle. It includes: an LPF 111 for removing high-frequency components capable of becoming noise from the detection signal outputted from the detecting coil 109b of the resonance motor 109; an amplifier circuit 112 for amplifying to a suitable amplitude the detection signal of which amplitude is small; a phase correcting circuit 113 for correcting phase shift of the detection signal caused by LPF 111 and amplifier circuit 112 so as to synchronize it with the detection signal of the detecting coil 109b; an amplitude control circuit 114 for outputting control signal Vcnt to regulate the amount of driving current by detecting the amplitude level of the detection signal; a gain control amplifier (GCA) 103 for varying the gain of the motor driving circuit 110 based on the voltage level of control signal Vcnt; and a driving current applying circuit 116 for applying signal $I_{DRV}$ to the driving coil 109a of the resonance motor 109. Further, the gain control amplifier (GCA) 103 is constructed by the variable resistance circuit 1 and non-inverting amplifier as shown in the seventh embodiment of FIG. 13.

The operation of thus constructed resonance motor driving circuit 110 will now be described. First, when the resonance motor 109 is driven so that the moving plate 120 or moving member 135 is deflected to a sufficient extent, a detection signal (sinusoidal waveform) is obtained from the detecting coil 126, 134. The detection signal is removed of noise such as due to disturbance through LPF 111 and is amplified by the amplifier circuit 112 to a level at which it can be readily processed. It is generated as detection signal Vf. Further, of the detection signal Vf, phase shift occurred at the LPF 111 or amplifier 112 is corrected at the phase correcting circuit 113 and it is generated as input signal Vin.

Further, the detection signal Vf is branched and inputted also to the amplitude control circuit 114. The amplitude control circuit 114 provides a control signal Vcnt so as to achieve a constant amplitude of the output of the amplifier 112 which is proportional to the deflection angle of the mirror. In other words, if the deflection angle is smaller than a target value, it generates and outputs control signal Vcnt so as to make greater the deflection angle, and, if greater than the target value, control signal Vcnt so as to make smaller the deflection angle.

Of the gain control amplifier (GCA) 103 to which the input signal Vin and control signal Vcnt are inputted, the gain of the gain control amplifier (GCA) 103 is varied by changing the equivalent resistance value occurring at the output of the variable resistance circuit 1 by the control signal Vcnt to be applied to the control terminal TC. The output of the gain control amplifier (GCA) 103 is converted into a driving current $I_{DRV}$ at the driving current applying circuit 116 and is applied to the driving coil 109a of the resonance motor 109. The resonance motor 109 is caused to operate by the driving current. At this time, a signal corresponding to the deflection angle is detected at the detecting coil 109b and inputted to LPF 111.

In this manner, a feedback is furnished so as to detect control signal Vcnt of which the value varies in accordance with the deflection angle. The deflection angle is controlled to a predetermined value by changing the gain of the gain control amplifier (GCA) 103 by means of the control signal Vcnt.

It is a feature of this embodiment to use the gain control amplifier (GCA) 103 of the configuration shown in FIG. 13 as the gain control amplifier (GCA) 103 of the above described resonance motor driving circuit 110. Accordingly, a motor driving circuit not depending on the characteristic of MOS transistor can be achieved. Further, when, for example, an absolute variance value of IC is previously written to a non-volatile memory so as to control an output to a constant value by using such data at the time of operation, the number of data to be written to the non-volatile memory can be reduced by using the circuit according to this embodiment.

As has been described, according to the ninth embodiment, an automatic gain control circuit of resonance motor driving circuit not depending on the characteristic of MOS transistor can be constructed.

Figure 18:
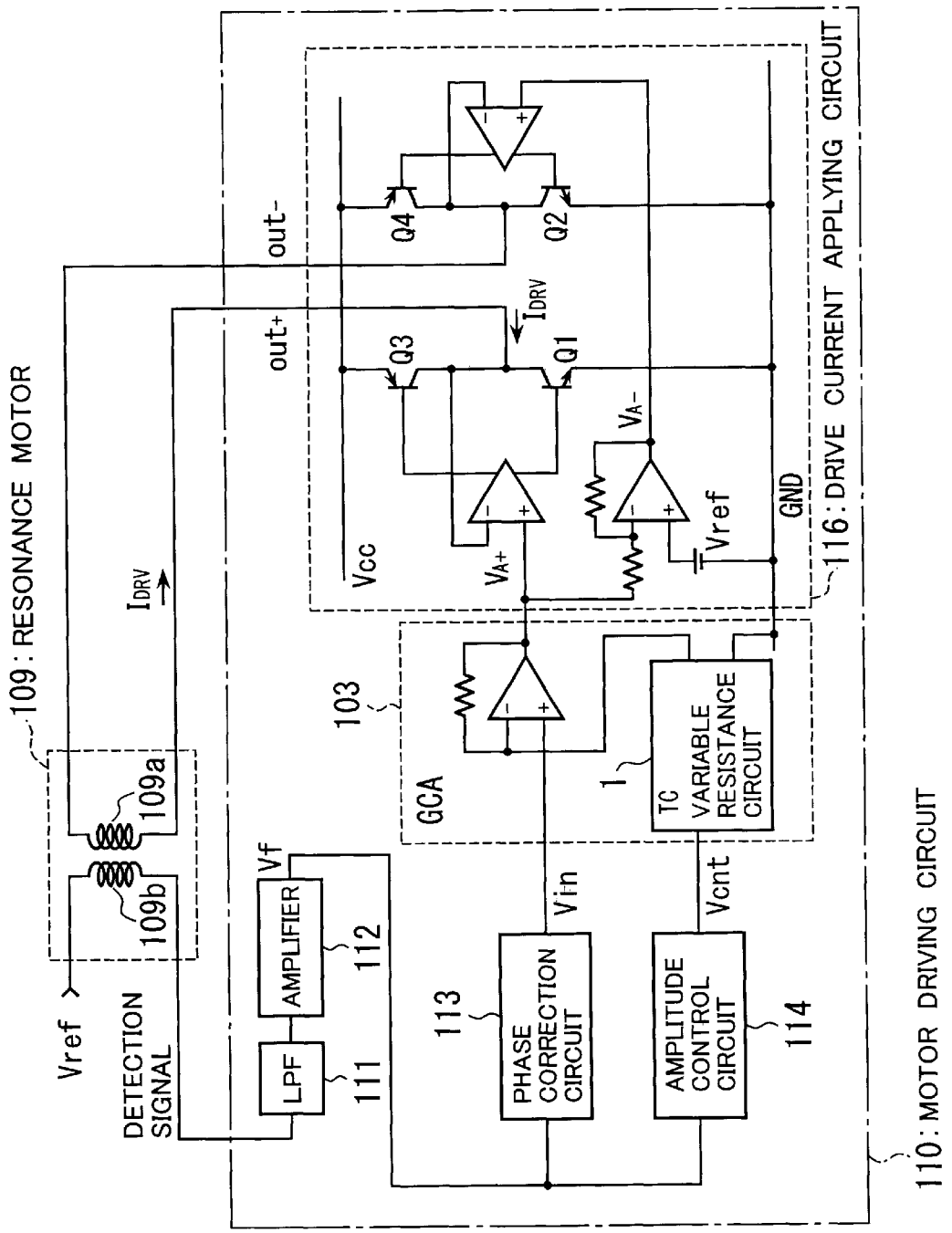
FIG. 18 is a circuit diagram showing as a tenth embodiment a modification of the automatic gain control circuit of the resonance motor shown FIG. 15.

A tenth embodiment shown in FIG. 18 will now be described. This embodiment relates to a modification of the automatic gain control circuit of the resonance motor shown in FIG. 15 and is constructed so that the current to be applied to the driving coil of the resonance motor can be provided in both directions. In particular, of the circuit according to this embodiment, the driving current applying circuit 116 is of a different type from that shown in FIG. 15. The driving current applying circuit 116 is constructed by an H-bridge circuit consisting of four bipolar transistors Q1, Q2, Q3, Q4 and three operational amplifiers so that currents of both positive and negative directions can be caused to flow along the driving coil 109a of motor 109. According to this embodiment, a resonance motor driving circuit not depending on the characteristic of MOS transistor can be constructed similarly to the ninth embodiment.

Figure 19:
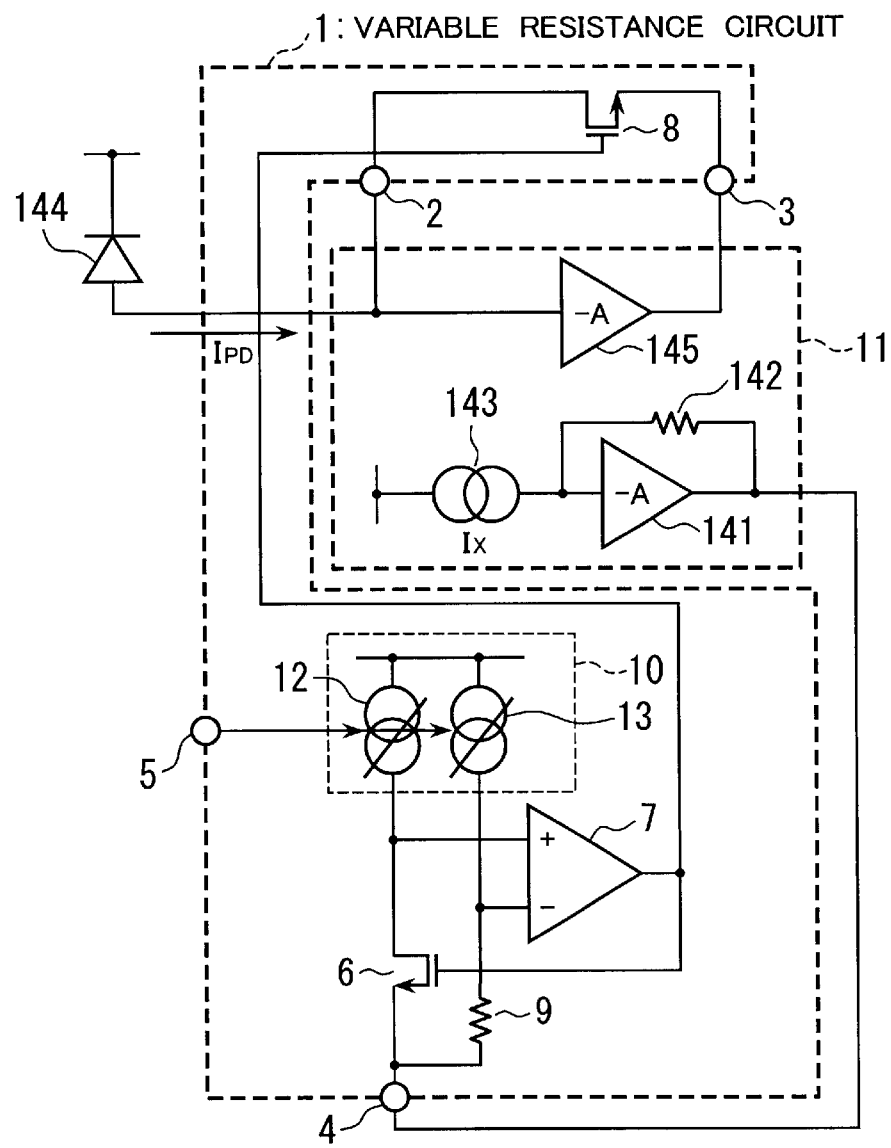
FIG. 19 is a circuit diagram showing a photo detecting circuit constructed by using the variable resistance circuit according to an eleventh embodiment of the invention.

An eleventh embodiment of the invention shown in FIG. 19 will now be described. This embodiment relates to a photoelectric current detecting circuit using the variable resistance circuit described in the first embodiment as shown in FIG. 7A (the type bringing the equivalent resistance terminal 3 and the reference voltage terminal 4 to the same electrical potential by means of the voltage copy circuit).

The voltage copy circuit 11 of this embodiment includes: a first inverting amplifier 141 connected at the output terminal thereof to the reference voltage terminal 4 of the variable resistance circuit 1; a resistor 142 connected between the input and output terminals of the inverting amplifier 141; a constant-current source 143 connected to the input terminal of the first inverting amplifier 141; and a second inverting amplifier 145 connected at the input terminal thereof to a photo detecting device 144 and one terminal 2 of the variable resistance circuit 1 and connected at the output terminal thereof to the other terminal 3 of the variable resistance circuit 1. It is premised that the first and second inverting amplifiers 141 and 145 are of an identical construction.

Figure 20:
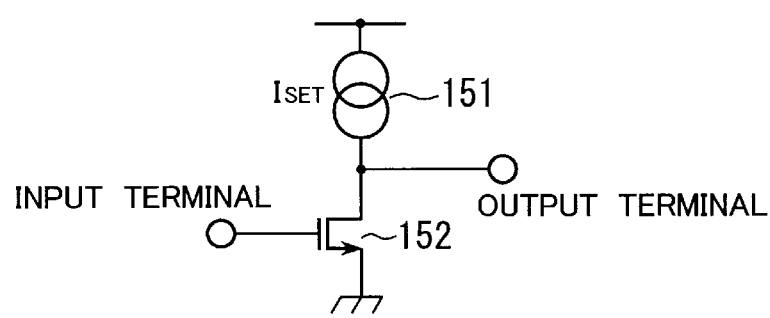
FIG. 20 is a circuit diagram showing a typical configuration of the first and second inverting amplifiers of the eleventh embodiment shown in FIG. 19.

An example of the construction of the first and second inverting amplifiers 141, 145 is shown in FIG. 20. This exemplary construction has a transistor 152 of which the source is grounded, the drain is connected to the output terminal together with a constant-current source 151, and the gate is connected to the input terminal. The inverting amplifier of this configuration is implemented by a smaller number of devices and operates at higher frequencies as compared to an inverting amplifier using operational amplifier circuit. It is used for example in detecting a reflection of light radiated on bar codes or a reflection of light radiated on pits recorded on optical disk and in amplifying signals of an optical fiber.

The operation of the photoelectric current detecting circuit using the variable resistance circuit of such construction will now be described. The resistor 142 is connected between the input terminal and output terminal of the inverting amplifier 141 and the terminals 2 and 3 of the variable resistance circuit 1 are connected to the input terminal and output terminal of the inverting amplifier 145 which is of the same configuration as the inverting amplifier 141, thereby both operating as negative feedback system. If the following inequality (22) holds in the case where the two inverting amplifiers are of the same configuration, supposing $I_{SET}$ as the current value of the constant-current source 151, $I_{PD}$ as the photoelectric current of the photo detecting device 144 and $I_X$ as the current value of the constant-current source 143:

$$I_{SET} \gg I_{PD}, I_X \tag{22}$$

the voltages occurring at the input terminals of the first and second inverting amplifiers 141, 145 become equal to each other. Here $I_{PD}$ represents the output current of the photo detecting device 144 and the usually detected current values are not constant and fall within a certain range. It in this case, however, means an average value, steady-state value, etc. of the current.

Further, If the following formula (23) holds when supposing the resistance value of the resistor 142 as $R_F$ and the drain-to-source resistance of MOS transistor 8 as Rds (M1):

$$R_F \cdot I_X = I_{PD} \cdot Rds(M1) \tag{23}$$

the voltage of the terminal 3 of the variable resistance circuit 1 becomes equal to the voltage at the reference voltage terminal 4, and the output current $I_{PD}$ of the photo detecting device 144 is converted into voltage by the equivalent resistance as shown in formula (16).

As has been described by way of the above embodiments, it is possible according to the present invention to implement a variable resistance circuit which has the same temperature characteristic as a reference resistor and of which the absolute value can be regulated (controlled) by electrical signals. Of the resistance output terminals of such variable resistance circuit, one terminal can be forced to be connected to a power supply having low impedance. Further, this variable resistance circuit can be combined with a circuit for copying a voltage based on the theory of virtual-short circuit of operational amplifier. By using those of the respective configurations, it is possible to obtain an integrating (filter) circuit for regulating time constant by electrical signals, and a gain control amplifier and automatic gain control circuit for regulating gain by electrical signals.

What is claimed is:

1. A variable resistance circuit comprising:

a control circuit having a plurality of constant-current output terminals, with a constant-current output ratio of the output terminals varied by electrical signals to by electrical signals to be applied to a control terminal;

an operational amplifier;

a resistor; and a plurality of MOS transistors having gates thereof connected in common;

wherein a first output terminal of said control circuit is connected to one end of said resistor and to an inverted input terminal of said operational amplifier, wherein a second output terminal of said control circuit is connected to a drain of a first of the plurality of MOS transistors and to a non-inverted input terminal of said operational amplifier, wherein a crate of the first MOS transistor is connected to an output terminal of said operational amplifier, wherein another end of said resistor and the source of said first MOS transistor are connected to a reference voltage terminal, and wherein said first MOS transistor is caused to operate in a triode region so as to use, as an equivalent resistance, the resistance between the source and drain of a second of the plurality of MOS transistors, the second MOS transistor having a gate connected to the output terminal of said operational amplifier and a source coupled directly to the reference voltage terminal.

2. The variable resistance circuit according to claim 1, wherein said control circuit is a current mirror circuit having: a plurality of intermediate outputs; a plurality of switches for selectively providing current from one or more of the intermediate outputs to a first output of the current mirror circuit; and a logic circuit for controlling said switches based on an input digital signal applied to a control terminal; a second output of said current mirror circuit being outputted from one intermediate output terminal of said control circuit and the rest of the plurality of outputs of said current mirror circuit being connected in common through said switches and being outputted as an added current from the first output terminal of said control circuit.

3. The variable resistance circuit according to claim 1, wherein the control circuit, operational amplifier and plurality of MOS transistors are formed on an integrated circuit, wherein the resister is a discrete element, not part of the integrated circuit, and wherein said equivalent resistance has the same temperature dependency as said resistor formed as the discrete part and having an absolute value thereof being controlled by electrical signals to be applied to the control terminal of said control circuit.

4. The variable resistance circuit according to claim 2, wherein the control circuit, operational amplifier and plurality of MOS transistors are formed on an integrated circuit,
   wherein the resister is a discrete element, not part of the integrated circuit, and
   wherein said equivalent resistance has the same temperature dependency as said resistor formed as the discrete part and having an absolute value thereof being controlled by electrical signals to be applied to the control terminal of said control circuit.

5. A circuit comprising:
   a) a variable resistance circuit including:
      i) a control circuit having a plurality of constant-current output terminals, with a constant-current output ratio of the output terminals varied by electrical signals to be applied to a control terminal;
      ii) a first operational amplifier;
      iii) a resistor; and
      iv) a plurality of MOS transistors having the gates thereof connected in common,
      wherein a first output terminal of said control circuit is connected to one end of said resistor and to an inverted input terminal of said first operational amplifier,
      wherein a second output terminal of said control circuit is connected to a drain of a first of the plurality of MOS transistors and to a non-inverted input terminal of said first operational amplifier,
      wherein a gate of the first MOS transistor is connected to an output terminal of said first operational amplifier,
      wherein another end of said resistor and a source of said first MOS transistor are connected to a reference voltage terminal, and
      wherein said first MOS transistor is caused to operate in a triode region so as to use, as an equivalent resistance, the resistance between the source and drain of a second of the plurality of MOS transistors, the second MOS transistor having a pate connected to the output terminal of said first operational amplifier,
   b) a voltage copy circuit including a second operational amplifier having a non-inverted terminal connected to the reference voltage terminal of said variable resistance circuit and having an inverted terminal connected to the source terminal of the second MOS transistor being one terminal of the equivalent resistance of said variable resistance circuit, wherein the source of the second MOS transistor is coupled through the voltage copy circuit to the reference voltage terminal;
   c) a reference voltage source connected to the reference voltage terminal of said variable resistance circuit; and
   d) a capacitor connected between the inverting input and output terminals of said second operational amplifier,
      wherein an input being rendered by the drain terminal of said second MOS transistor being the other terminal of the equivalent resistance of said variable resistance circuit and an output being rendered by the output terminal of said second operational amplifier.

6. A high-order filter circuit comprising:
   a) a variable resistance circuit including:
      i) control circuit having a plurality of constant-current output terminals, with a constant-current output ratio of the output terminals varied by electrical signals to be applied to a control terminal;
      ii) a plurality of first operational amplifiers;
      iii) a resistor;
      iv) a first set of MOS transistors having the gates thereof connected in common; and
      v) a second set of MOS transistors having gates thereof connected in common,
      wherein a first output terminal of said control circuit is connected to one end of said resistor and to an inverted input terminal of each of said plurality of first operational amplifiers,
      wherein other output terminals of said control circuit are connected, respectively, to the drains of a first MOS transistor from each of the first and second sets of MOS transistors,
      wherein gates of the plurality of MOS transistors of each of the first and second sets of MOS transistors are coupled, respectively, to output terminals of said plurality of first operational amplifiers,
      wherein the other output terminals of said control circuit are connected, respectively, to a non-inverted input terminal of each of said plurality of first operational amplifiers,
      wherein another end of said resistor and the sources of the first MOS transistor from each of the first and second sets of MOS transistors are connected to a reference voltage terminal, and
      wherein the first MOS transistor from each of the first and second sets of MOS transistors are caused to operate in a triode region so as to use, as a plurality of equivalent resistances, the resistances, respectively, between the sources and drains of others MOS transistors from each of the first and second sets of MOS transistors which have gates connected, respectively, to an output terminal of each of said plurality of first operational amplifiers;
   b) plurality of voltage copy circuits including a plurality of second operational amplifiers having non-inverted terminals connected to the reference voltage terminal of said variable resistance circuit and having inverted terminals connected to the respective source terminals of the other MOS transistors from each of the first and second sets of MOS transistors and being one terminal of the plurality of equivalent resistances of said variable resistance circuit, and
      wherein others of the MOS transistors from each of the first and second sets of MOS transistors have sources respectively connected, through the plurality of voltage copy circuits, to the reference voltage terminal;
   c) a reference voltage source connected to the reference voltage terminal of said variable resistance circuit; and
   d) capacitors connected respectively between the input and output terminals of said plurality of second operational amplifiers,
      wherein said plurality of equivalent resistances and said plurality of second operational amplifiers are alternatively connected in series, and
      wherein an input is provided to the drain terminal of the other MOS transistors from each of the first and second sets of MOS transistors being the other terminal of the equivalent resistance of said variable resistance circuit and an output is provided by the output terminal of one of said second operational amplifiers.

7. A circuit comprising:
a) a variable resistance circuit including:
   i) a control circuit having a plurality of constant-current output terminals, with a constant-current output ratio of the output terminals varied by electrical signals to be applied to a control terminal;
   ii) an operational amplifier;
   iii) a resistor; and
   iv) a plurality of MOS transistors having the gates thereof connected in common,
      wherein one output terminal of said control circuit is connected to one end of said resistor and to an inverted input terminal of said operational amplifier,
      wherein another output terminal of said control circuit is connected to a drain of a first MOS transistor,
      wherein a gate of the first MOS transistor is connected to an output terminal of said operational amplifier and the other output terminal of said control circuit being connected to a non-inverted input terminal of said operational amplifier,
      wherein the other end of said resistor and a source of said first MOS transistor is connected to a reference voltage terminal, and
      wherein said one MOS transistor is caused to operate in a triode region so as to use, as equivalent resistances, the respective resistance between the respective source and the respective drain of two other MOS transistors each connected at the respective gate thereof to the output terminal of said operational amplifier;
b) a voltage copy circuit including a totally balanced operational amplifier connected at the inverted input terminal and non-inverted input terminal thereof respectively to the sources of the two other MOS transistors being the respective one terminals of said two equivalent resistances and at the common-mode terminal thereof to the reference voltage terminal of said variable resistance circuit, wherein each of the two other MOS transistors is connected at the respective source thereof, through the voltage copy circuit, to the reference voltage terminal;
c) a reference voltage source being connected to the reference voltage terminal of said variable resistance circuit; and
d) capacitors connected respectively between the inverted input terminal and non-inverted output terminal and between the non-inverted input terminal and inverted output terminal of said totally balanced operational amplifier,
   wherein inputs being applied to the respective drain terminals of the two other MOS transistors being the other terminals of said two equivalent resistances and outputs being provided by the respective output terminals of the totally balanced operational amplifier.

8. A gain control amplifier comprising:
a) a variable resistance circuit including:
   i) a control circuit having a plurality of constant-current output terminals, with a constant-current output ratio of the output terminals varied by electrical signals to be applied to a control terminal;
   ii) a first operational amplifier;
   iii) a first resistor; and
   iv) a plurality of MOS transistors having the gates thereof connected in common,
      wherein one output terminal of said control circuit is connected to one end of said first resistor and to an inverted input terminal of said first operational amplifier,
      wherein another output terminal of said control circuit is connected to a drain of a first MOS transistor,
      wherein a gate of the one MOS transistor is connected to an output terminal of said first operational amplifier,
      wherein the other output terminal of said control circuit is connected to a non-inverted input terminal of said first operational amplifier,
      wherein the other end of said first resistor and a source of said one MOS transistor are connected to a reference voltage terminal, and
      wherein said one MOS transistor is caused to operate in a triode region so as to use, as an equivalent resistance, the resistance between a source and drain of the other MOS transistor having a gate connected to the output terminal of said first operational amplifier and at a source connected to the reference voltage terminal;
b) a second operational amplifier having an inverted input terminal connected to a drain terminal of said other MOS transistor and being one terminal of the equivalent resistance of said variable resistance circuit; and
c) a second resistor connected between the inverted input terminal and output terminal of the second operational amplifier,
   wherein the reference voltage terminal of said variable resistance circuit is grounded,
   wherein an input by is provided to the non-inverted terminal of said second operational amplifier and an output is provided by the output terminal of the second operational amplifier, and
   wherein the gain of the circuit is controlled by electrical signals to be inputted to said control terminal of said variable resistance circuit.

9. An automatic gain control circuit comprising:
a) a control apparatus including a gain control amplifier comprising:
   i) a variable resistance circuit including:
      A) a control circuit having a plurality of constant-current output terminals, with a constant-current output ratio of the output terminals varied by electrical signals to be applied to a control terminal;
      B) a first operational amplifier;
      C) a first resistor; and
      D) a plurality of MOS transistors having gates connected in common,
         wherein one output terminal of said control circuit is connected to one end of said first resistor and to an inverted input terminal of said first operational amplifier,
         wherein another output terminal of said control circuit is connected to the drain of a first MOS transistor having a gate connected to an output terminal of said first operational amplifier and being connected to a non-inverted input terminal of said first operational amplifier,
         wherein another end of said first resistor and a source of said one MOS transistor are connected to a reference voltage terminal, and wherein said first MOS transistor is caused to operate in a triode region so as to use, as an equivalent resistance, the resistance between the source and drain of the other MOS transistor having a gate connected to the output terminal of said first operational amplifier and a source connected to the reference voltage terminal;

ii) a second operational amplifier having an inverted input terminal connected to a drain terminal of said other MOS transistor and being one terminal of the equivalent resistance of said variable resistance circuit; and iii) a second resistor connected between the inverted input terminal and output terminal of the second operational amplifier;

wherein the reference voltage terminal of said variable resistance circuit is grounded, wherein an input is provided to the non-inverted terminal of said second operational amplifier and an output is provided by the output terminal of the second operational amplifier, and wherein the gain of the circuit being controlled by electrical signals to be inputted to said control terminal of said variable resistance circuit;

b) a controlled system for outputting an electrical signal; and c) a feedback element;

wherein the gain of said control apparatus is controlled by said feedback element so as to bring to a predetermined value the electrical signal or physical quantity which is an output of said controlled system.

10. The automatic gain control circuit according to claim 9, wherein said controlled system comprises a resonance motor including: a permanent magnet for providing a magnetic field; a scan mirror cyclically oscillated to reciprocatingly scan a laser beam in a predetermined direction; an elastic member for supporting the scan mirror and for providing an oscillating drive force; and a coil section having two windings consisting of driving winding and detecting winding disposed adjacent to said permanent magnet.

11. A photoelectric current detecting circuit comprising:

a) a variable resistance circuit including:
  i) a control circuit having a plurality of constant-current output terminals, with a constant-current output ratio of the output terminals varied by electrical signals to be applied to a control terminal;
  ii) an operational amplifier;
  iii) a first resistor; and
  iv) a plurality of MOS transistors having the gates thereof connected in common,
    wherein one output terminal of said control circuit being connected to one end of said first resistor and to an inverted input terminal of said operational amplifier,
    wherein the other output terminal of said control is connected to a drain of a first MOS transistor, and being connected to a non-inverted input terminal of said operational amplifier,
    wherein a gate of the first MOS transistor is connected to an output terminal of said operational amplifier,
    wherein another end of said first resistor and a source of said one MOS transistor are connected to a reference voltage terminal, and
    wherein said one MOS transistor is caused to operate in a triode region so as to use, as an equivalent resistance, the resistance between the source and drain of the other MOS transistor connected at the gate thereof to the output terminal of said operational amplifier;

b) a voltage copy circuit including:
  i) a first inverting amplifier having an output terminal connected to the reference voltage terminal of said variable resistance circuit;
  ii) a constant-current source connected to the input terminal of said first inverting amplifier;
  iii) a second resistor connected between input and output terminals of said first inverting amplifier; and
  iv) a second inverting amplifier of the same configuration as said first inverting amplifier connected at the an output terminal thereof to a source of the other MOS transistor which is one terminal of the equivalent resistance of said variable resistance circuit and connected at the input terminal thereof to the drain which is the other terminal, wherein the source of the other MOS transistor is connected, through the voltage copy circuit, to the reference voltage terminal; and c) a photo detecting device connected to the input terminal of said second inverting amplifier.

12. A variable resistance circuit comprising:

a control circuit having a plurality of constant-current output terminals, with a constant-current output ratio of the output terminals varied by electrical signals to by electrical signals to be applied to a control terminal;

an operational amplifier;

a resistor; and a plurality of MOS transistors having gates thereof connected in common;

wherein a first output terminal of said control circuit is connected to one end of said resistor and to an inverted input terminal of said operational amplifier, wherein a second output terminal of said control circuit is connected to a drain of a first of the plurality of MOS transistors and to a non-inverted input terminal of said operational amplifier, wherein a gate of the first MOS transistor is connected to an output terminal of said operational amplifier, wherein another end of said resistor and the source of said first MOS transistor are connected to a reference voltage terminal, and wherein said first MOS transistor is caused to operate in a triode region so as to use, as an equivalent resistance, the resistance between the source and drain of a second of the plurality of MOS transistors, the second MOS transistors having a gate connected to the output terminal of said operational amplifier and a source coupled, through a voltage copy circuit, to the reference voltage terminal.

* * * * *